US012757370B2

(12) United States Patent
Chu et al.

(10) Patent No.: US 12,757,370 B2
(45) Date of Patent: Oct. 6, 2026

(54) SRAM WITH STAGGERED STACKED FET

(71) Applicant: INTERNATIONAL BUSINESS MACHINES CORPORATION, Armonk, NY (US)

(72) Inventors: Albert M. Chu, Nashua, NH (US); Carl Radens, LaGrangeville, NY (US); Ruilong Xie, Niskayuna, NY (US); Brent A. Anderson, Jericho, VT (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 697 days.

(21) Appl. No.: 17/820,580

(22) Filed: Aug. 18, 2022

(65) Prior Publication Data

US 2024/0064951 A1 Feb. 22, 2024

(51) Int. Cl.
*H10B 10/00* (2023.01)
*H10D 12/01* (2025.01)

(52) U.S. Cl.
CPC ........... *H10B 10/125* (2023.02); *H10D 12/01* (2025.01)

(58) Field of Classification Search
CPC ...... H10B 10/125; H10B 10/12; H10D 12/01; H10D 48/031; H10D 12/031; H10D 88/00; H10D 30/6735; H10D 84/85; H10D 62/118; H10D 12/03; G11C 11/411–4125
See application file for complete search history.

(56) References Cited

U.S. PATENT DOCUMENTS

| | | | | |
|---|---|---|---|---|
| 10,192,819 | B1 | 1/2019 | Chanemougame | |
| 10,192,867 | B1 | 1/2019 | Frougier | |
| 10,510,622 | B1 | 12/2019 | Frougier | |
| 10,707,218 | B2 | 7/2020 | Paul | |
| 10,756,096 | B2 | 8/2020 | Paul | |
| 10,770,479 | B2 | 9/2020 | Smith | |
| 10,777,505 | B2 | 9/2020 | Chang | |
| 10,811,415 | B2 | 10/2020 | Sengupta | |
| 2019/0287957 | A1* | 9/2019 | Anderson | G11C 11/41 |
| 2020/0075574 | A1 | 3/2020 | Smith | |
| 2020/0111798 | A1* | 4/2020 | Paul | H10B 10/125 |
| 2020/0135735 | A1* | 4/2020 | Sengupta | H10D 84/853 |
| 2020/0203355 | A1* | 6/2020 | Wu | H10D 84/834 |
| 2021/0296314 | A1 | 9/2021 | Kang | |
| 2022/0367520 | A1* | 11/2022 | Hong | H10D 62/121 |
| 2023/0345693 | A1* | 10/2023 | Wang | H10D 30/6735 |
| 2023/0354570 | A1* | 11/2023 | Hwang | H10B 10/18 |
| 2023/0422520 | A1* | 12/2023 | Fan | H10B 80/00 |

OTHER PUBLICATIONS

Wang et al., U.S. Appl. No. 63/335,137, filed Apr. 26, 2022, pp. 1-13 (Year: 2022).*

(Continued)

*Primary Examiner* — Matthew C Landau
*Assistant Examiner* — David W Ward
(74) *Attorney, Agent, or Firm* — Samuel A. Waldbaum

(57) ABSTRACT

A microelectronic structure including a static random-access memory (SRAM) device that includes a plurality of stacked transistors. Each of the plurality of stacked transistors that includes a bottom transistor and an upper transistor, where the upper transistor is not in vertical alignment with the bottom transistor.

17 Claims, 28 Drawing Sheets

Cross section $Y_1$

(56) References Cited

OTHER PUBLICATIONS

Wang et al., U.S. Appl. No. 63/335,137, filed Apr. 26, 2022, p. 14 (Year: 2022).*
Wang et al., U.S. Appl. No. 63/335,137, filed Apr. 26, 2022, pp. 1-13 (Year: 2022) (Year: 2022).*
Wang et al., U.S. Appl. No. 63/335,137, filed Apr. 26, 2022, p. 14 (Year: 2022) (Year: 2022).*
Chang et al., "First Demonstration of CMOS inverter and 6T-SRAM Based on GAA CFETs Structure for 3D-IC applications", International Electron Devices Meeting (IEDM), 2019, pp. 11.7.1-11.7.4.
Ryckaert et al., "The Complementary FET (CFET) for CMOS scaling beyond N3", 2018 Symposium on VLSI Technology Digest of Technical Papers, pp. 141-142.

* cited by examiner

TOP-DOWN VIEW

Cross section $X_1$

Cross section $X_2$

Cross section $Y_1$

Cross section $Y_2$

TOP-DOWN VIEW

Cross section $X_1$

Cross section $X_2$

Cross section $Y_2$

Cross section $Y_1$

TOP-DOWN VIEW

Cross section $X_1$

Cross section $X_2$

Cross section $Y_1$

Cross section $Y_2$

TOP-DOWN VIEW

Cross section $X_2$

Cross section $X_1$

Cross section $Y_1$

Cross section $Y_2$

TOP-DOWN VIEW

Cross section $Y_1$

Cross section $Y_2$

Cross section $X_2$

Cross section $X_1$

Cross section $Y_2$

Cross section $Y_1$

Cross section $X_1$

Cross section $X_2$

Cross section $Y_1$

Cross section $Y_2$

TOP-DOWN VIEW

Cross section $X_1$

Cross section $X_2$

Cross section $Y_1$

Cross section $Y_2$

TOP-DOWN VIEW

Cross section $X_1$

Cross section $X_2$

Cross section $Y_2$

Cross section $Y_1$

Cross section $X_2$

Cross section $X_1$

Cross section $Y_1$

Cross section $Y_2$

Cross section $X_2$

Cross section $X_1$

Cross section $Y_2$

Cross section $Y_1$

SRAM WITH STAGGERED STACKED FET

BACKGROUND

The present invention generally relates to the field of microelectronic, and more particularly to formation of an interconnected located in a gate cut, where the interconnected connects at least two components on different devices.

Nanosheet is the lead device architecture in continuing CMOS scaling. However, nanosheet technology has shown issues when scaling down such that as the devices become smaller and closer together, they are interfering with each other. A way to increase the device density is by stacking the devices. However, stacking the devices makes it difficult to form connections to the bottom device and to form shared gate devices.

BRIEF SUMMARY

Additional aspects and/or advantages will be set forth in part in the description which follows and, in part, will be apparent from the description, or may be learned by practice of the invention.

A microelectronic structure including a static random-access memory (SRAM) device that includes a plurality of stacked transistors. Each of the plurality of stacked transistors that includes a bottom transistor and an upper transistor, where the upper transistor is not in vertical alignment with the bottom transistor.

A microelectronic structure including a static random-access memory (SRAM) device that includes a plurality of stacked transistors. Each of the plurality of stacked transistors that includes a bottom transistor and an upper transistor, where the upper transistor is not in vertical alignment with the bottom transistor. A bottom dummy transistor and a shared contact. The shared contact is connected to an upper source/drain of the upper transistor and a bottom source/drain of the bottom transistor, and where the shared contact is in contact with the bottom dummy device.

A method including forming a plurality of bottom transistors. Forming a dummy device adjacent to the plurality of bottom transistors and forming a sacrificial layer on top of a bottom source/drain and on top of a dummy device. Forming a plurality of upper transistor on top of the plurality of bottom transistors and the sacrificial layer, where each of the upper transistors are not in vertical alignment with any of the plurality of bottom transistors.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
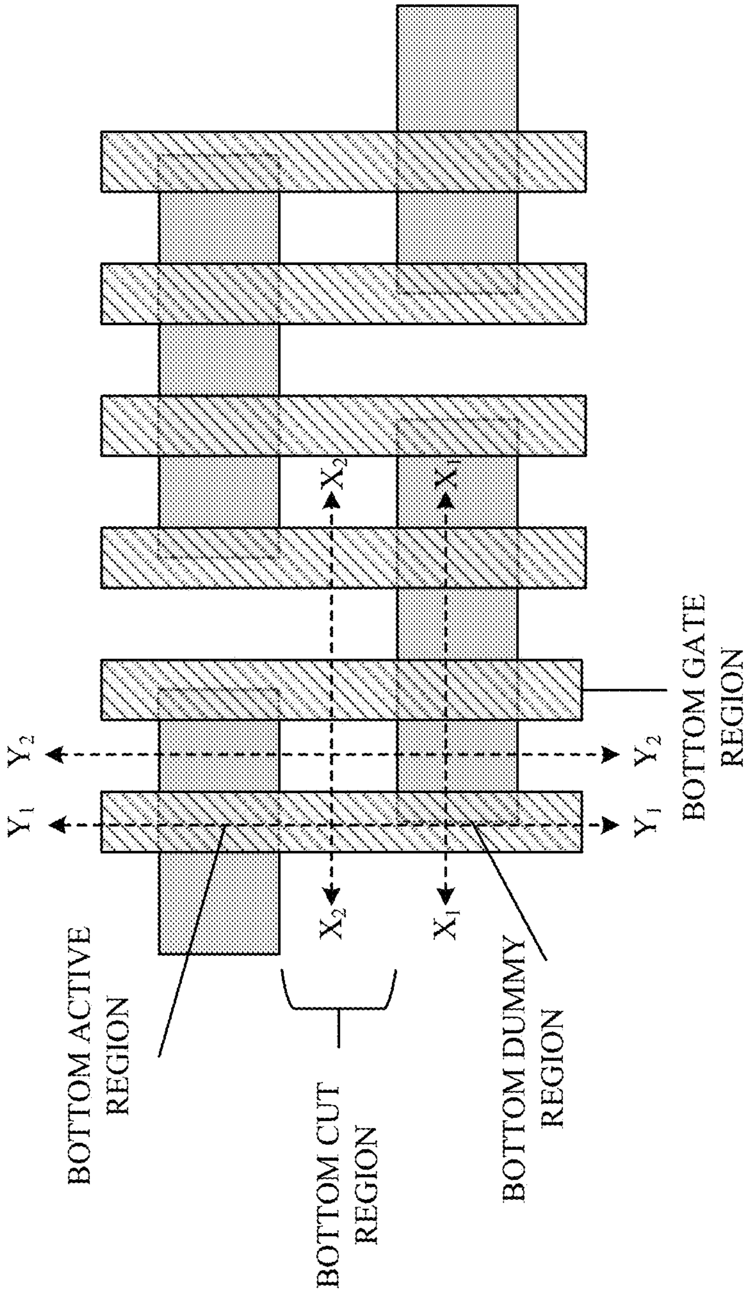
FIG. 1 illustrates a top-down view of multiple bottom devices, in accordance with the embodiment of the present invention.
Figure 2:
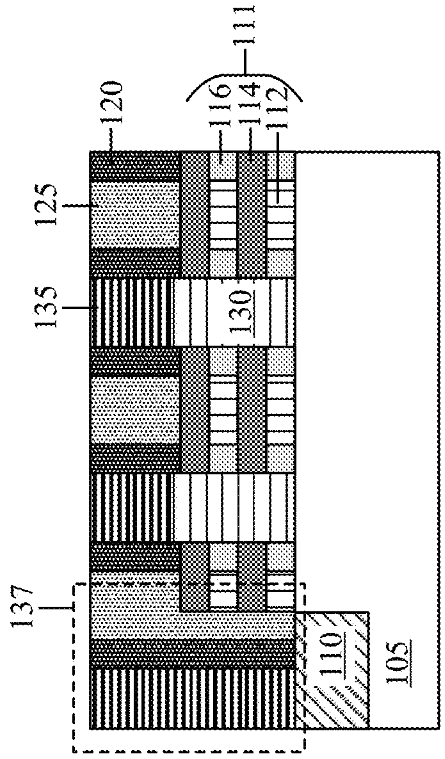
FIG. 2 illustrates a cross section $X_1$ of the bottom nano stack of offset stacked device in the gate region, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards stacked FET or stacked transistors, where the upper device (upper transistor) and lower device (lower transistor) are not vertically aligned. The upper device is offset from the lower device, such that the vertical center of the upper device is not located above the center of the lower device. The present invention is directed towards creating a static random-access memory (SRAM) device using offset stacked devices (i.e., where the upper device is not vertically aligned with the lower device). Some of the lower devices or transistors are connected to an upper transistor to create the necessary electrical connection to form the SRAM device.

FIG. 1 illustrates a top-down view of multiple bottom devices, in accordance with the embodiment of the present invention. The present invention is a SRAM device that is comprised of one or more bottom devices (or transistors) having a plurality of bottom nano stacks and a plurality of offset upper devices (or transistors) having a plurality of offset upper nano stacks. The plurality of offset upper nano stacks will be described in further detail down below. Cross section $X_1$ extends horizontally through one of the bottom nano stacks of one of the bottom devices. Cross section $X_2$ extends horizontally through the space located between different bottom nano stacks. Cross section $Y_1$ is perpendicular to cross section $X_1$ and $X_2$, where cross section $Y_1$ is through a gate region that spans across multiple bottom nano stacks. Cross section $Y_2$ is perpendicular to cross section $X_1$ and $X_2$, where cross section $Y_2$ is through the source/drain region of multiple bottom nano stacks.

FIGS. 2, 3, 4, and 5 illustrate the processing stage after fabrication of dummy gate 125, a bottom nano stack 111, bottom source/drain 130 and a bottom interlayer dielectric layer 135. The bottom stacked device includes a substrate 105, a shallow trench isolation layer 110, a plurality of bottom nano stacks 111, a bottom source/drain 130, an upper spacer 120, a dummy gate 125, and a bottom interlayer dielectric layer 135. The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 may be doped, undoped or contain doped regions and undoped regions therein.

The each of the plurality of bottom nano stacks 111 includes a plurality of sacrificial layers 112, a plurality of channel layers 114 (i.e., nanosheets), and an inner spacer 116. The plurality of sacrificial layers 112 can be comprised of SiGe, where Ge is in the range of about 15% to 35%. The inner spacer 116 is located adjacent to the sacrificial layers 112. One of the channel layers 114 is located above each of the sacrificial layers 112 and the inner spacer 116. The plurality of channel layers 114 can be comprised of, for example, Si. An upper spacer 120 is located on top of a channel layer 114 and the dummy gate 125 is located between sections of the upper spacer 120. The number of layers illustrated in each of the plurality of bottom nano stacks 111 is for illustrative purposes only, each of the bottom nano stacks 111 can be comprised fewer or more layers than what is illustrated by the Figures. Furthermore, the Figures illustrates that the upper spacer 120 is located on top of a channel layer 114, alternatively the upper spacer 120 can be located on top of the inner spacer 116 causing the dummy gate 125 to be located on top of a sacrificial layer 112. A bottom source/drain 130 is located between bottom nano stacks 111.

The bottom source/drain 130 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. A bottom interlayer dielectric layer 135 is located on top of the bottom source/drain 130. Dashed box 137 emphasizes the end of one of the bottom nano stacks 111 that has one end of the nano stack enclosed by the dummy gate 125. This bottom nano stack 111 contained within dashed box 137 would be considered a dummy device since the stack is not connected to both a source and a drain.

Figure 3:
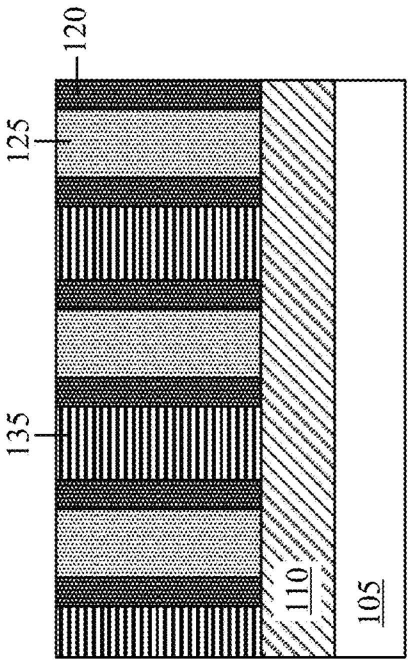
FIG. 3 illustrates a cross section $X_2$ of the bottom nano stack of offset stacked device in the bottom cut region, in accordance with the embodiment of the present invention.
Figure 4:
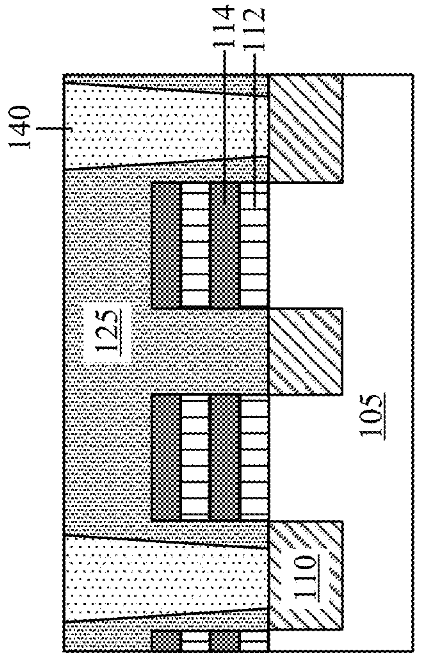
FIG. 4 illustrates a cross section $Y_1$ of the bottom nano stack of the offset stacked device in the gate region, in accordance with the embodiment of the present invention.
Figure 5:
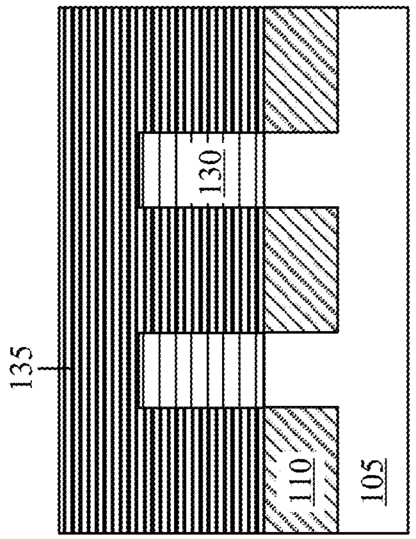
FIG. 5 illustrates a cross section $Y_2$ of the gate region of the bottom nano stack of the offset stacked device in the source/drain region, in accordance with the embodiment of the present invention.

FIG. 3 illustrates the gate region extending across the space located between the bottom nano stacks 111. An upper nano stack 171 will be formed above this location, i.e., the upper nano stack 171 will be formed above cross-section $X_2$ as illustrated by FIG. 3 (which will be described in further detail below). By locating the upper nano stacks 171 between sections of the bottom nano stacks 111, causes the bottom nano stacks 111 to be offset from the upper nano stacks 171. FIG. 4 illustrates a cross-section $Y_1$ across the gate region. The channel layers 114 and sacrificial layers 112 are enclosed by the dummy gate 125. Gate cuts 140 are formed in the dummy gate 125 by forming a trench and filling the trench with a dielectric material. The gate cuts 140 will act as partitions between the bottom nano stacks 111, thus the gate cuts 140 will determine if a shared gate or independent gate will be formed between the bottom nano stacks 111. As illustrated by FIG. 4, a shared gate will be formed between the sets of channel layers 114, since there are two sets of channel layers 114 located between the two gate cuts 140.

Figure 6:
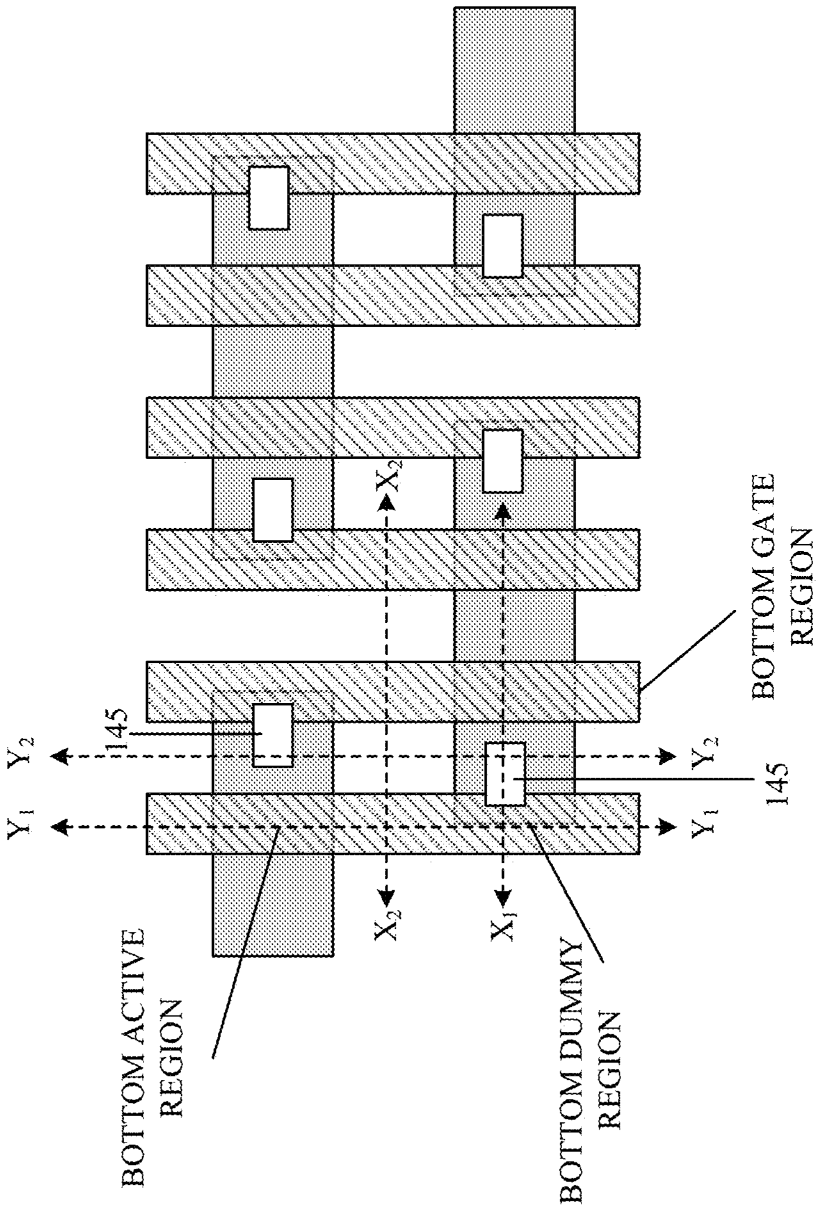
FIG. 6 illustrates a top-down view of multiple bottom devices after the formation of a bottom interconnect recess, in accordance with the embodiment of the present invention.
Figure 7:
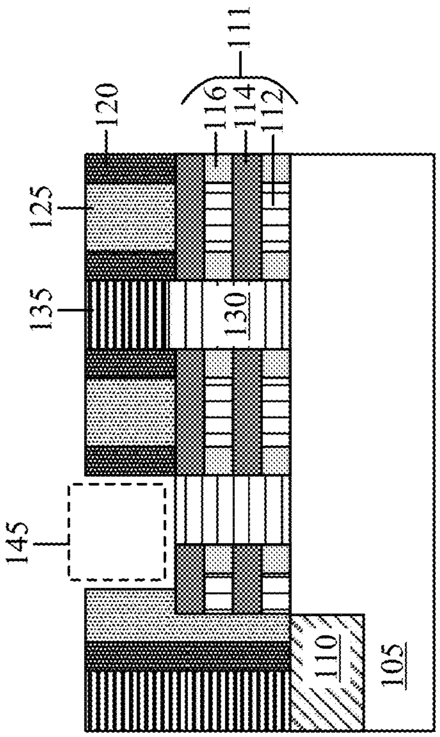
FIG. 7 illustrates a cross section $X_1$ of the bottom nano stack of offset stacked device in the gate region after the formation of a bottom interconnect recess, in accordance with the embodiment of the present invention.
Figure 8:
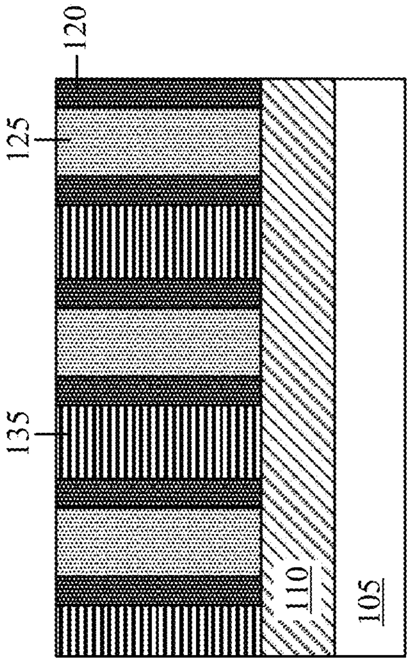
FIG. 8 illustrates a cross section $X_2$ of the bottom nano stack of offset stacked device in the bottom cut region after the formation of a bottom interconnect recess, in accordance with the embodiment of the present invention.
Figure 10:
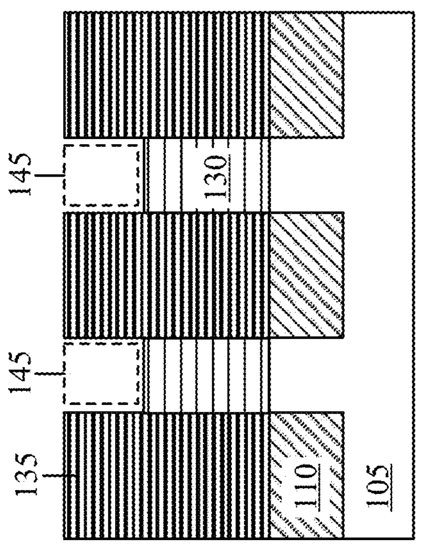
FIG. 10 illustrates a cross section $Y_2$ of the gate region of the bottom nano stack of the offset stacked device in the source/drain region after the formation of a bottom interconnect recess, in accordance with the embodiment of the present invention.
Figure 9:
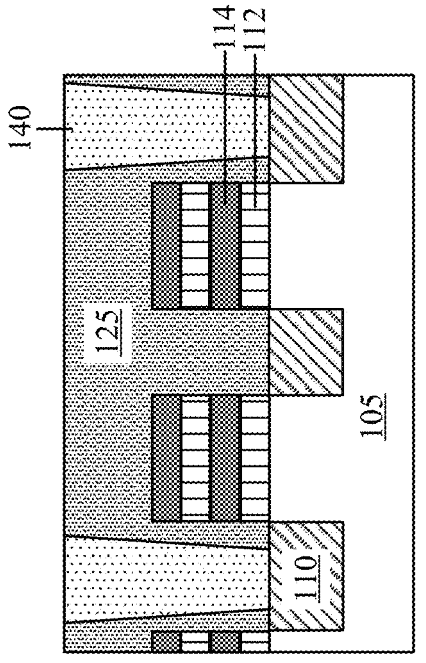
FIG. 9 illustrates a cross section $Y_1$ of the bottom nano stack of the offset stacked device in the gate region after the formation of a bottom interconnect recess, in accordance with the embodiment of the present invention.
Figure 11:
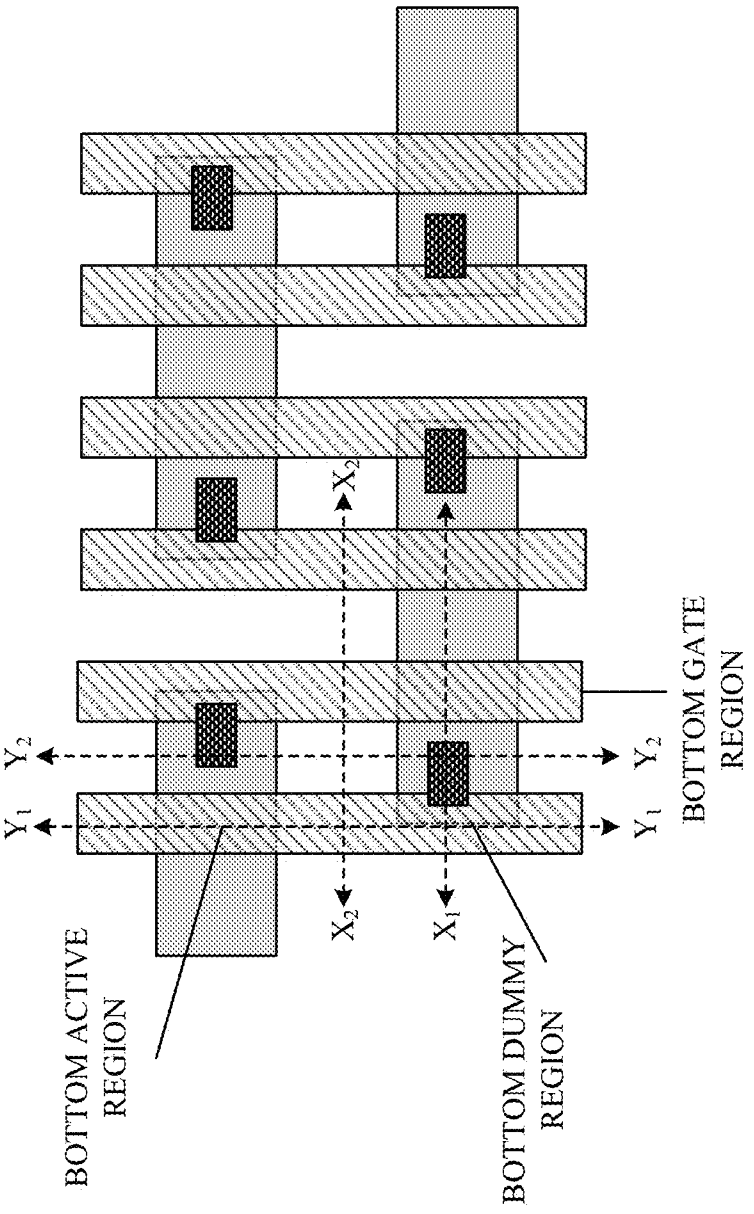
FIG. 11 illustrates a top-down view of multiple bottom devices after the formation of a bottom interconnect sacrificial layer, in accordance with the embodiment of the present invention.
Figure 12:
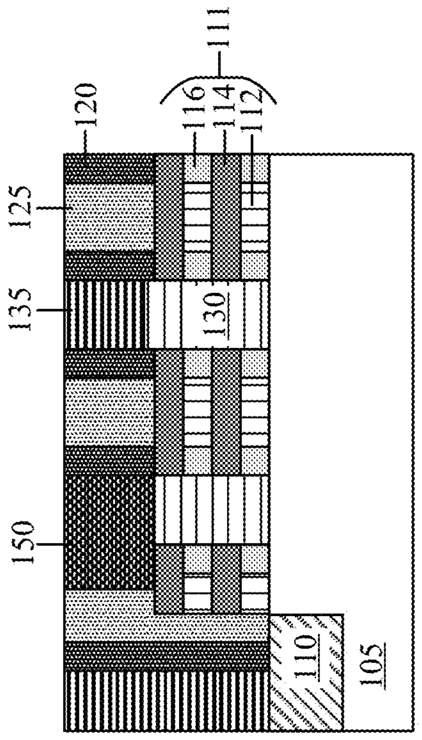
FIG. 12 illustrates a cross section $X_1$ of the bottom nano stack of offset stacked device in the gate region after the formation of a bottom interconnect sacrificial layer, in accordance with the embodiment of the present invention.
Figure 13:
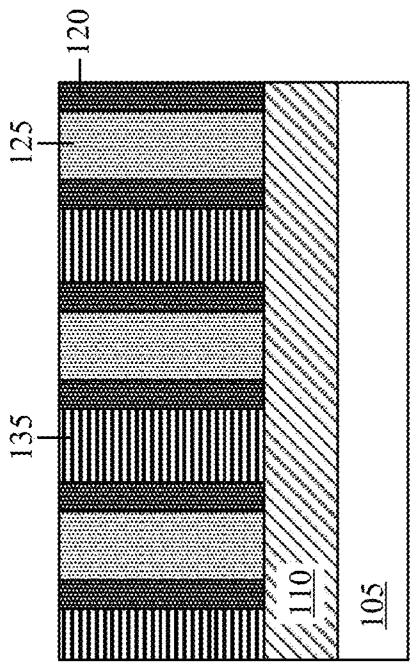
FIG. 13 illustrates a cross section $X_2$ of the bottom nano stack of offset stacked device in the bottom cut region after the formation of a bottom interconnect sacrificial layer, in accordance with the embodiment of the present invention.
Figure 14:
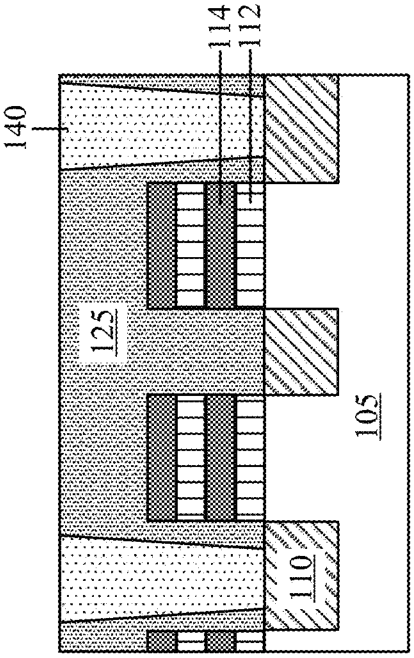
FIG. 14 illustrates a cross section $Y_1$ of the bottom nano stack of the offset stacked device in the gate region after the formation of a bottom interconnect sacrificial layer, in accordance with the embodiment of the present invention.
Figure 15:
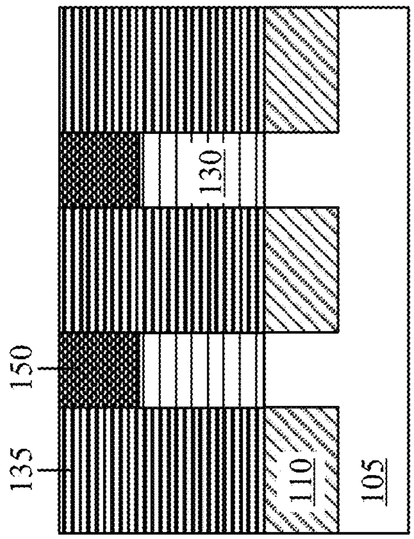
FIG. 15 illustrates a cross section $Y_2$ of the gate region of the bottom nano stack of the offset stacked device in the source/drain region after the formation of a bottom interconnect sacrificial layer, in accordance with the embodiment of the present invention.

FIGS. 6, 7, 8, 9, and 10, illustrate the processing stage after fabrication of a bottom interconnect recess 145. FIG. 6 illustrates a top-down view showing the placement of the bottom interconnect recess 145 at the location of the dummy devices. As illustrated by FIG. 7, the bottom interconnect recess 145 is located on top of a bottom source/drain 130 and on top of a channel layer 114. The bottom interconnect recess 145 extends laterally into the dummy gate 125 located around the dummy device. FIG. 10 illustrates that the bottom interlayer dielectric layer 135 is etched above the bottom source/drains 130 for the formation of the bottom interconnect recess 145.

FIGS. 11, 12, 13, 14 and 15, illustrate the processing stage after filling the bottom interconnect recess 145 with a sacrificial material to form a bottom interconnect sacrificial layer 150. The bottom interconnected recesses 145 are filled with a sacrificial material, for example, $TiO_x$, $AlO_x$, or a similar sacrificial material to form the bottom interconnect sacrificial layers 150.

Figure 16:
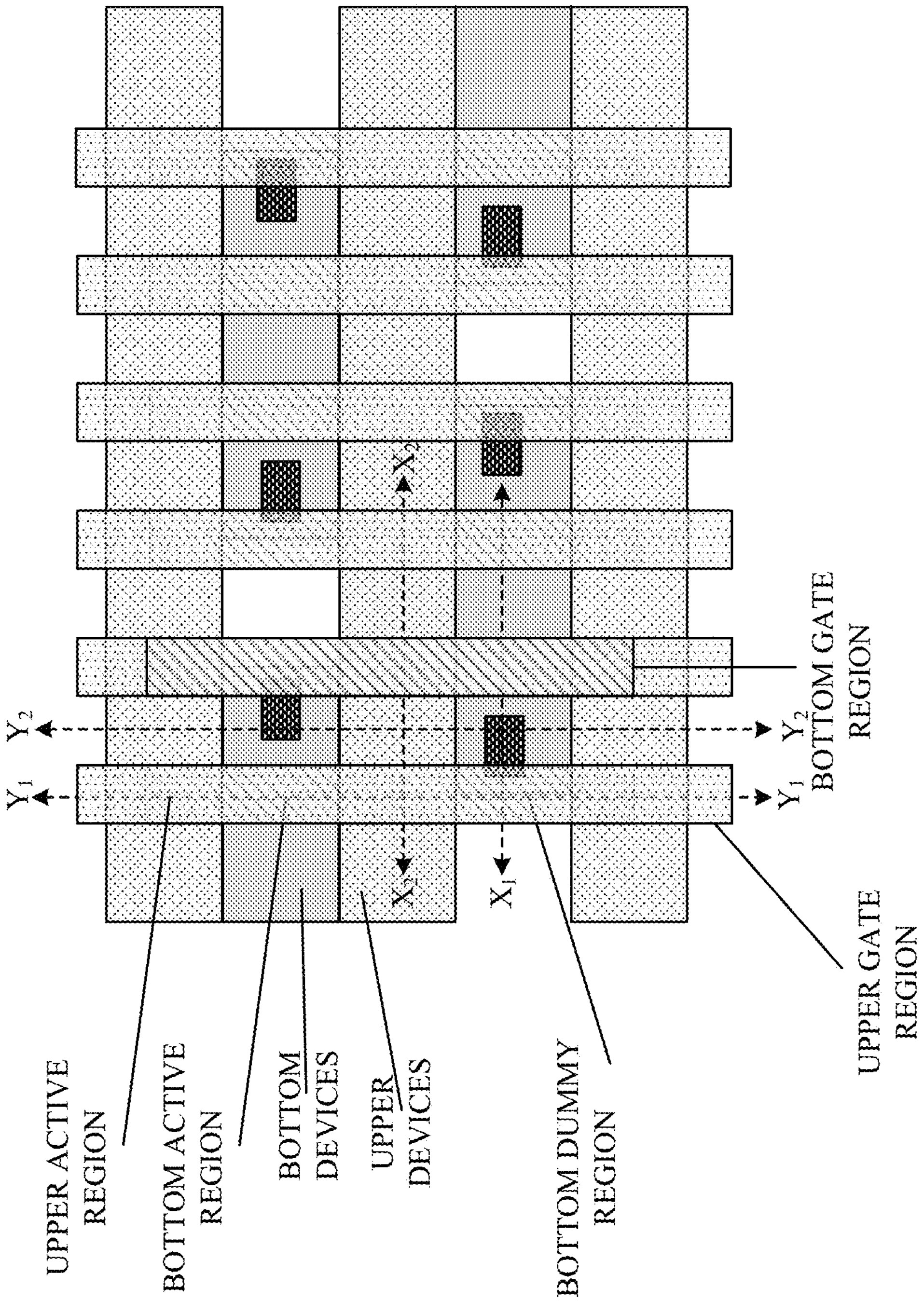
FIG. 16 illustrates a top-down view of the offset devices after the formation of a plurality of offset upper devices, in accordance with the embodiment of the present invention.

FIGS. 16, 17, 18, 19 and 20, illustrate the processing stage after fabrication of a plurality of upper devices. FIG. 16 illustrates that the upper nano stacks 171 are formed between the bottom nano stacks 111. This allows for the upper nano stacks 171 to be offset from the bottom nano stacks 111. A bonding oxide 155 is located on top of the bottom devices, and the upper devices are located on top of the bonding oxide 155.

Each of the plurality of upper nano stacks 171 includes a plurality of upper sacrificial layers 172, a plurality of upper channel layers 174 (i.e., nanosheets), and an upper inner spacer 176. The plurality of upper sacrificial layers 172 can be comprised of SiGe, where Ge is in the range of about 15% to 35%. The upper inner spacer 176 is located adjacent to the upper sacrificial layers 172. One of the upper channel layers 174 is located above each of the upper sacrificial layers 172 and the upper inner spacer 276. The plurality of upper channel layers 174 can be comprised of, for example, Si. A top spacer 160 is located on top of an upper channel layer 174 and the upper dummy gate 165 is located between sections of the top spacer 160. The number of layers illustrated in each of the plurality of upper nano stacks 171 is for illustrative purposes only, each of the upper nano stacks 171 can be comprised fewer or more layers than what is illustrated by the Figures. Furthermore, the Figures illustrates that the top spacer 160 is located on top of an upper channel layer 174, alternatively the top spacer 160 can be located on top of the upper inner spacer 176 causing the upper dummy gate 165 to be located on top of an upper sacrificial layer 172. An upper source/drain 180 is located between upper nano stacks 171.

The upper source/drain 180 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. An upper interlayer dielectric 170 is located on top of the upper source/drain 180.

Figure 18:
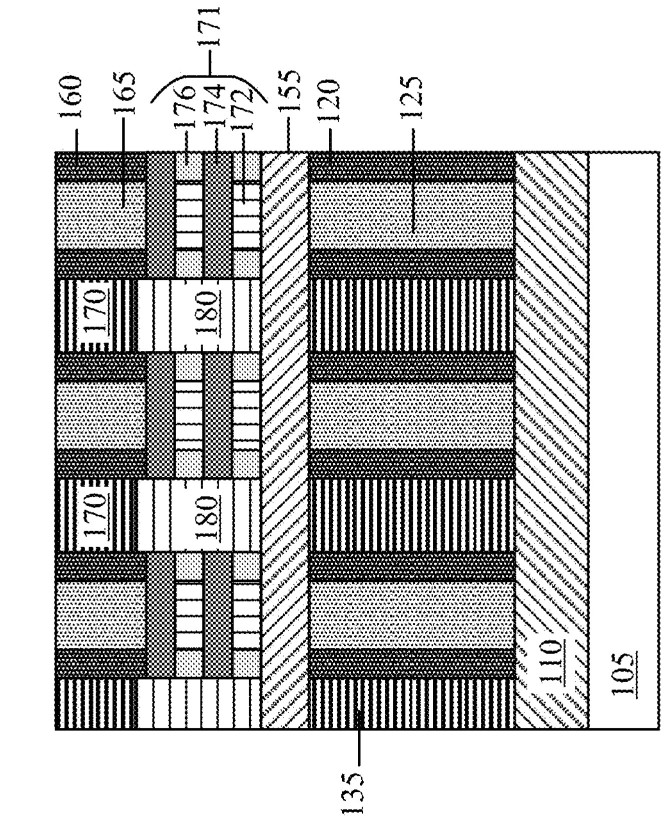
FIG. 18 illustrates a cross section $X_2$ of the bottom nano stack of offset stacked device in the bottom cut region after the formation of a plurality of offset upper device, in accordance with the embodiment of the present invention.
Figure 17:
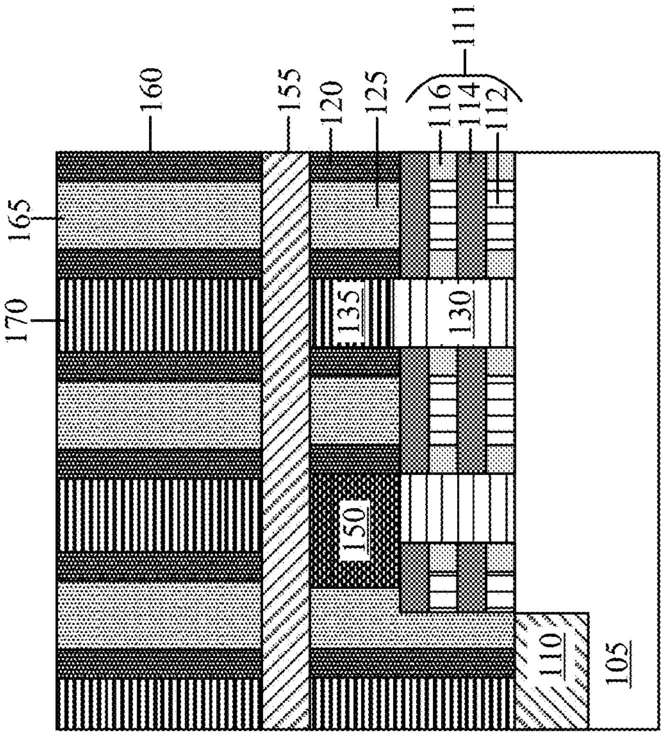
FIG. 17 illustrates a cross section $X_1$ of the bottom nano stack of offset stacked device in the gate region after the formation of a plurality of offset upper device, in accordance with the embodiment of the present invention.
Figure 19:
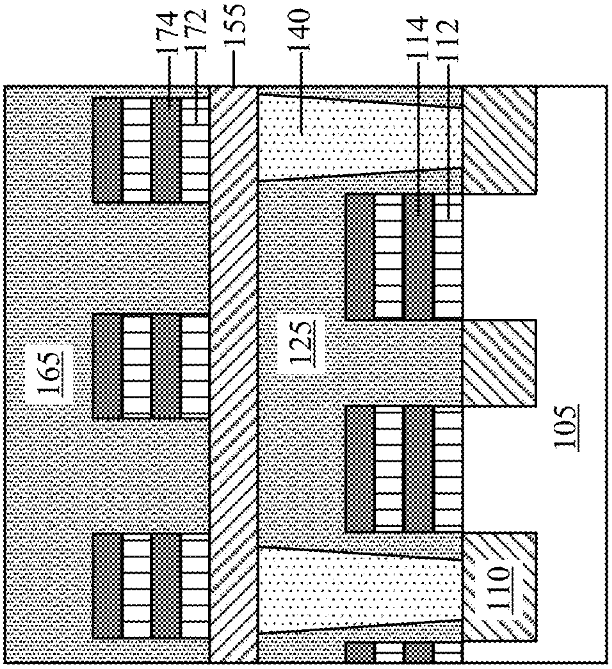
FIG. 19 illustrates a cross section $Y_1$ of the bottom nano stack of the offset stacked device in the gate region after the formation of a plurality of offset upper device, in accordance with the embodiment of the present invention.
Figure 20:
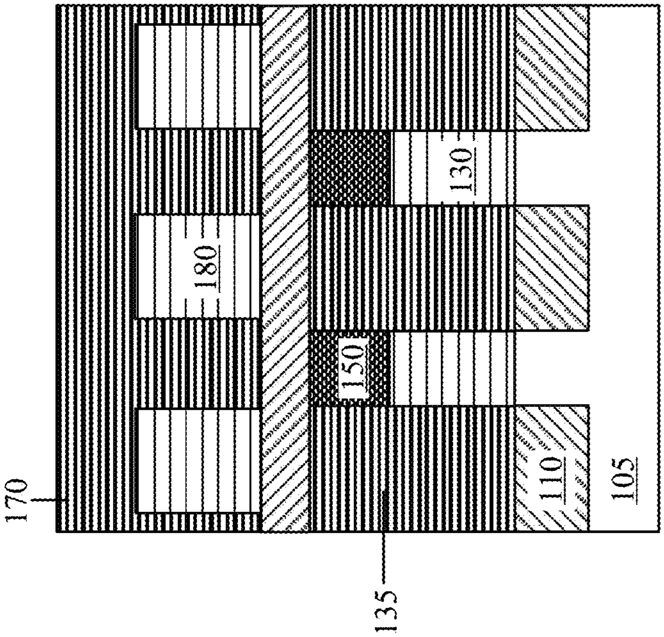
FIG. 20 illustrates a cross section $Y_2$ of the gate region of the bottom nano stack of the offset stacked device in the source/drain region after the formation of a plurality of offset upper device, in accordance with the embodiment of the present invention.

FIG. 17 illustrates the gate region extending across the space located between the upper nano stacks 171, such that no active channels are located above (i.e., vertically aligned with) the bottom nano stacks 111. FIG. 18 illustrates that the upper nano stacks 171 are located above (i.e., vertically aligned) with the dummy gate 125 in the region without active channels. FIG. 19 illustrates a cross section across the gate region. The upper channel layers 174 and sacrificial layers 172 are enclosed by the upper dummy gate 165. Furthermore, as illustrated by FIG. 19, the upper channel layers 174 are not vertically aligned with the bottom channel layers 114. As illustrated by FIG. 20, the upper source/drains 180 are not aligned on top of the bottom source/drains 130.

Figure 21:
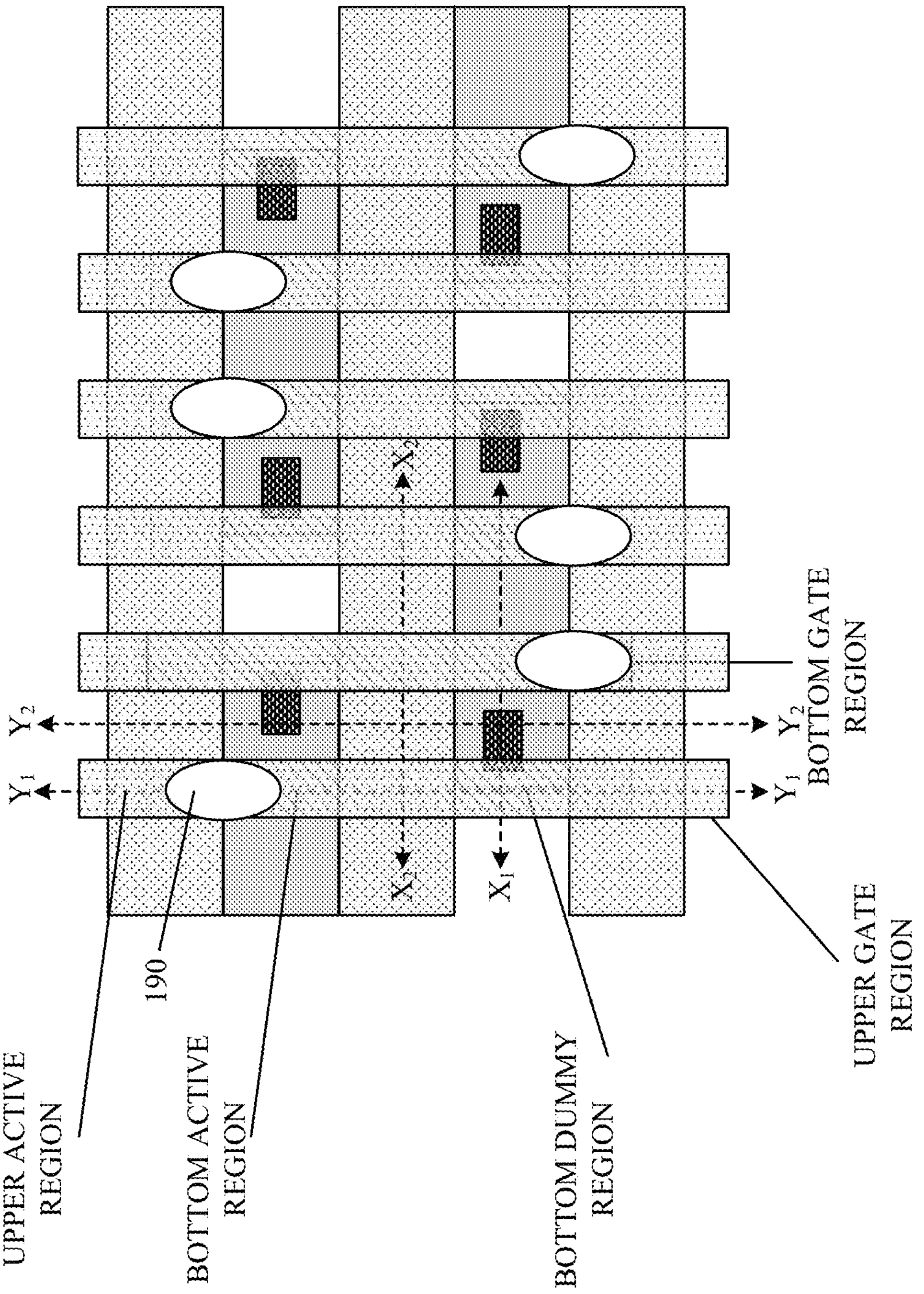
FIG. 21 illustrates a top-down view of the offset devices after the formation of a trench through the bonding oxide, in accordance with the embodiment of the present invention.
Figure 22:
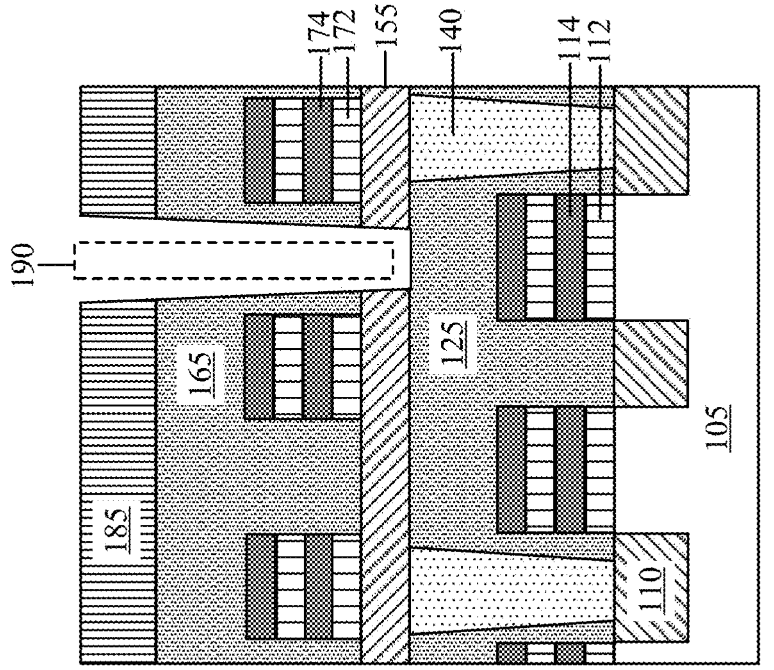
FIG. 22 illustrates a cross section $Y_1$ of the bottom nano stack of the offset stacked device in the gate region after the formation of a trench through the bonding oxide, in accordance with the embodiment of the present invention.
Figure 23:
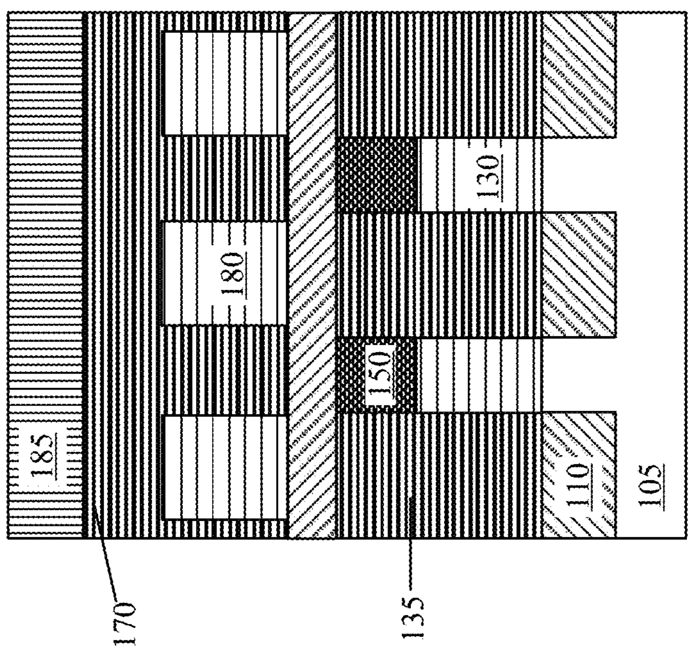
FIG. 23 illustrates a cross section $Y_2$ of the gate region of the bottom nano stack of the offset stacked device in the source/drain region after the formation of a trench through the bonding oxide, in accordance with the embodiment of the present invention.
Figure 25:
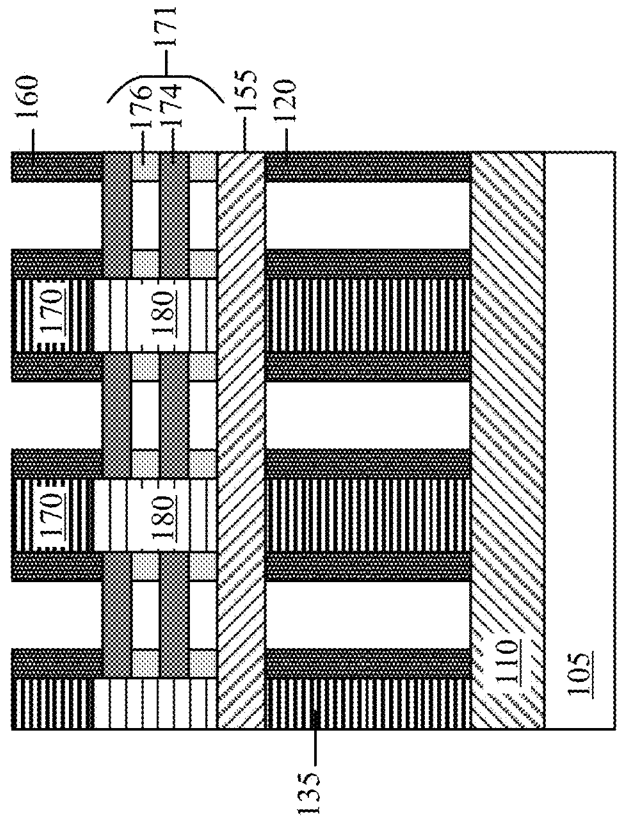
FIG. 25 illustrates a cross section $X_2$ of the bottom nano stack of offset stacked device in the bottom cut region after the removal of the dummy gates and the sacrificial layers, in accordance with the embodiment of the present invention.
Figure 24:
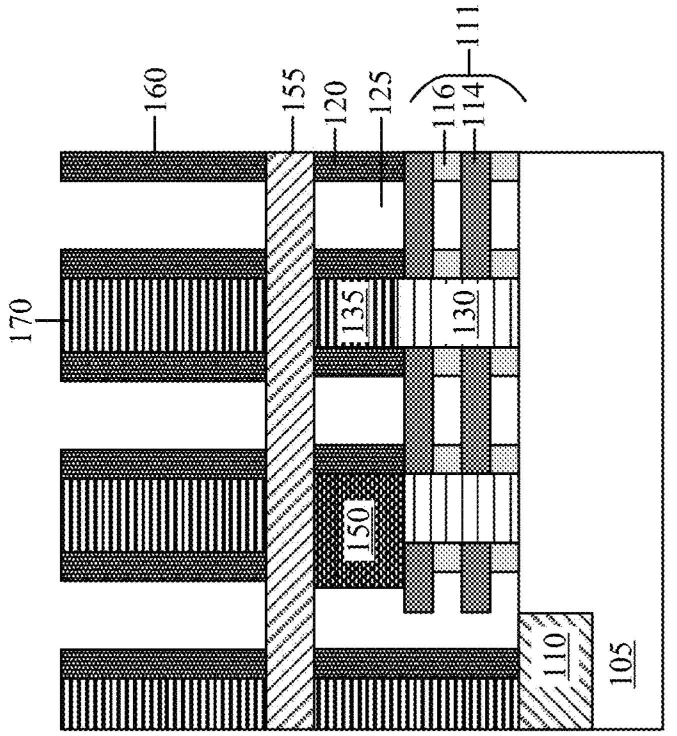
FIG. 24 illustrates a cross section $X_1$ of the bottom nano stack of offset stacked device in the gate region after the removal of the dummy gates and the sacrificial layers, in accordance with the embodiment of the present invention.
Figure 27:
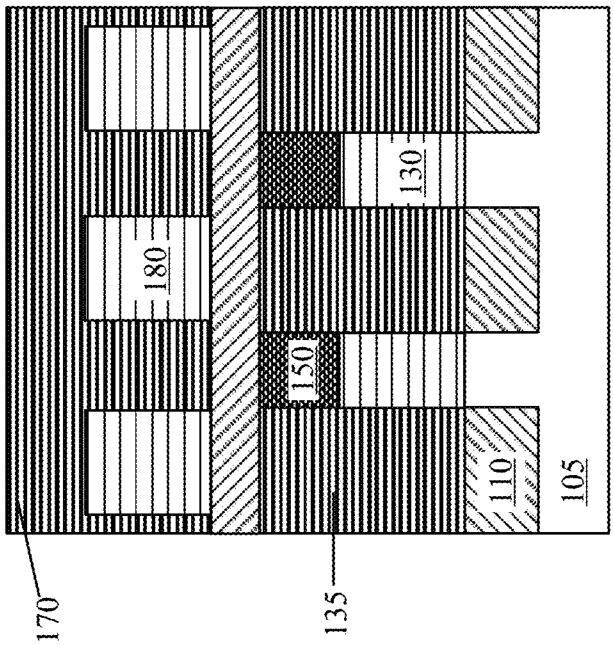
FIG. 27 illustrates a cross section $Y_2$ of the gate region of the bottom nano stack of the offset stacked device in the source/drain region after the removal of the dummy gates and the sacrificial layers, in accordance with the embodiment of the present invention.
Figure 26:
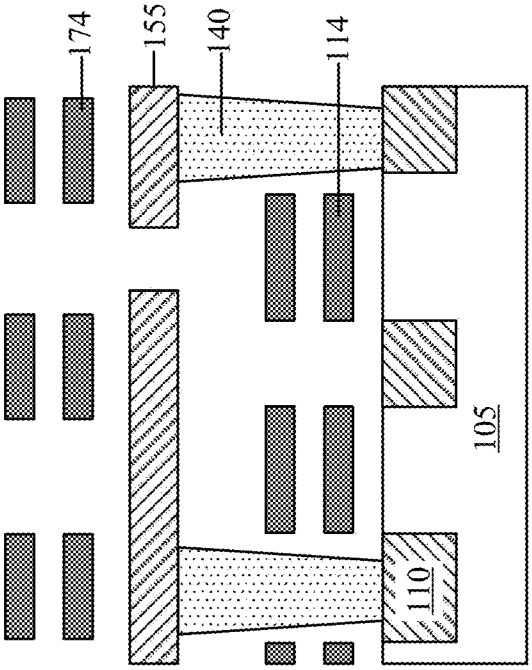
FIG. 26 illustrates a cross section $Y_1$ of the bottom nano stack of the offset stacked device in the gate region after the removal of the dummy gates and the sacrificial layers, in accordance with the embodiment of the present invention.
Figure 28:
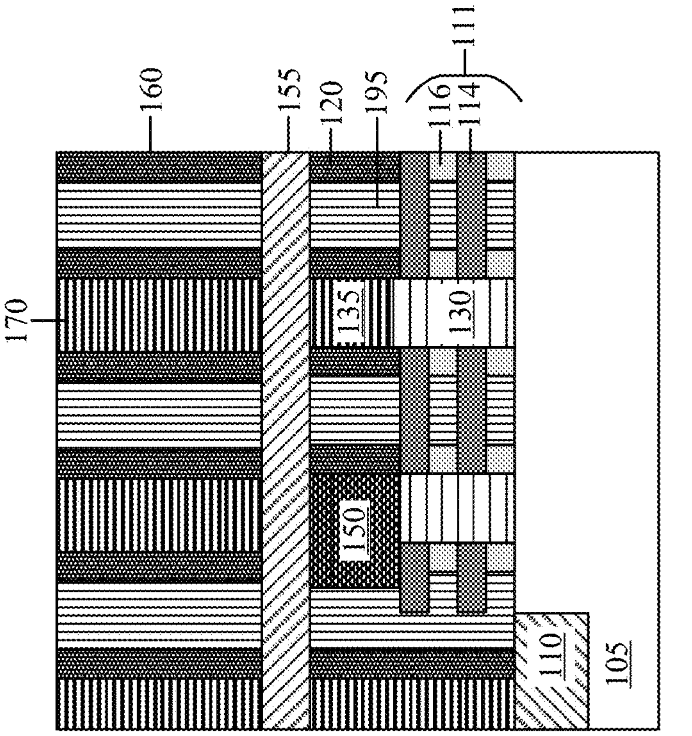
FIG. 28 illustrates a cross section $X_1$ of the bottom nano stack of offset stacked device in the gate region after the formation of a gate, in accordance with the embodiment of the present invention.
Figure 29:
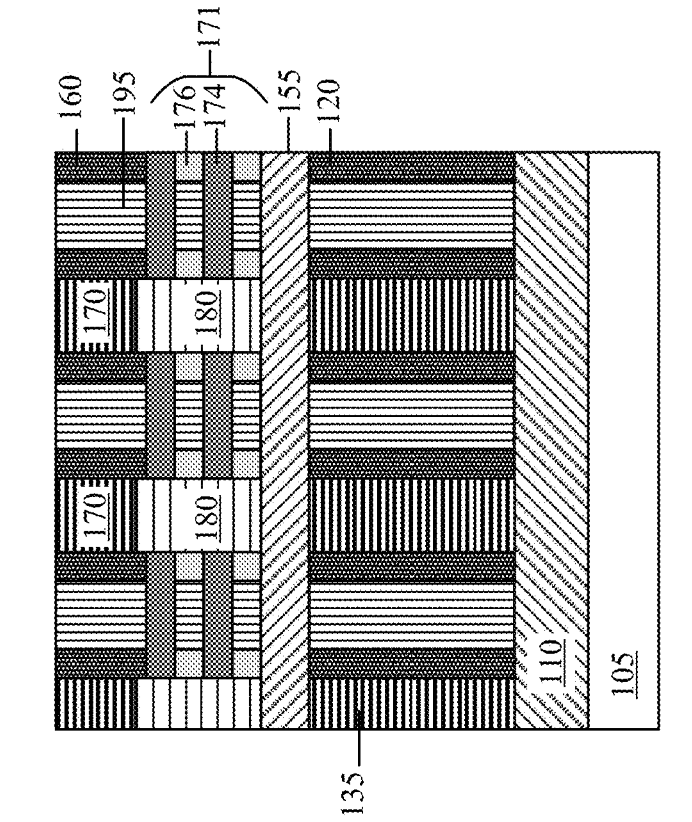
FIG. 29 illustrates a cross section $X_2$ of the bottom nano stack of offset stacked device in the bottom cut region after the formation of a gate, in accordance with the embodiment of the present invention.

FIGS. 21, 22 and 23, illustrate the processing stage after fabrication of a trench through the bonding oxide layer. As illustrated by FIG. 22, a lithography layer 185 is formed on top of the upper dummy gate 165 and the upper interlayer dielectric 170. A lithography layer 185 is patterned and a trench 190 is formed in the upper dummy gate 165. The trench 190 extends downwards through the upper gate 165 and through the bonding oxide 155. The trench 190 exposes a surface of the dummy gate 125.

FIGS. 24, 25, 26 and 27, illustrate the processing stage after the removal of the dummy gates and the sacrificial layers. The dummy gate 125 and the upper dummy gate 165 are selectively removed. Furthermore, the upper sacrificial layers 172 of the upper nano stacks 171 and the sacrificial layers 112 of the bottom nano stack 111 are selectively removed. The removal of these layers creates a space for the formation of the gate 195.

Figure 30:
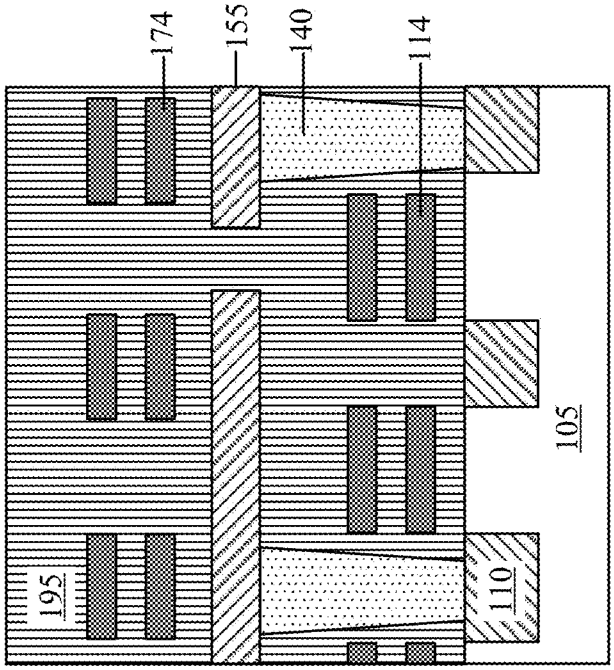
FIG. 30 illustrates a cross section $Y_1$ of the bottom nano stack of the offset stacked device in the gate region after the formation of a gate, in accordance with the embodiment of the present invention.
Figure 31:
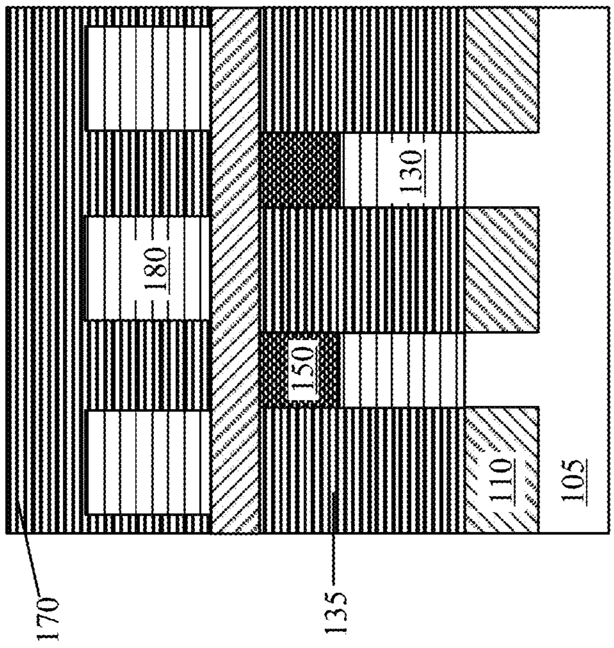
FIG. 31 illustrates a cross section $Y_2$ of the gate region of the bottom nano stack of the offset stacked device in the source/drain region after the formation of a gate, in accordance with the embodiment of the present invention.

FIGS. 28, 29, 30 and 31, illustrate the processing stage after the formation of the gate 195. A gate 195 is formed in the space created by the removal of the dummy gates 125, 165, and the sacrificial layers 112, 172. The gate 195 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. As illustrated by FIG. 30, the gate 195 surrounds each of the channel layers 114 of the bottom nano stack 111 and the upper channel layers 174 of the upper nano stack 171. Furthermore, since trench 190 created a hole in the bonding oxide 155 it allowed the gate 195 material to form a continuous path between at least one bottom nano stack 111 and at least one upper nano stack 171.

Figure 32:
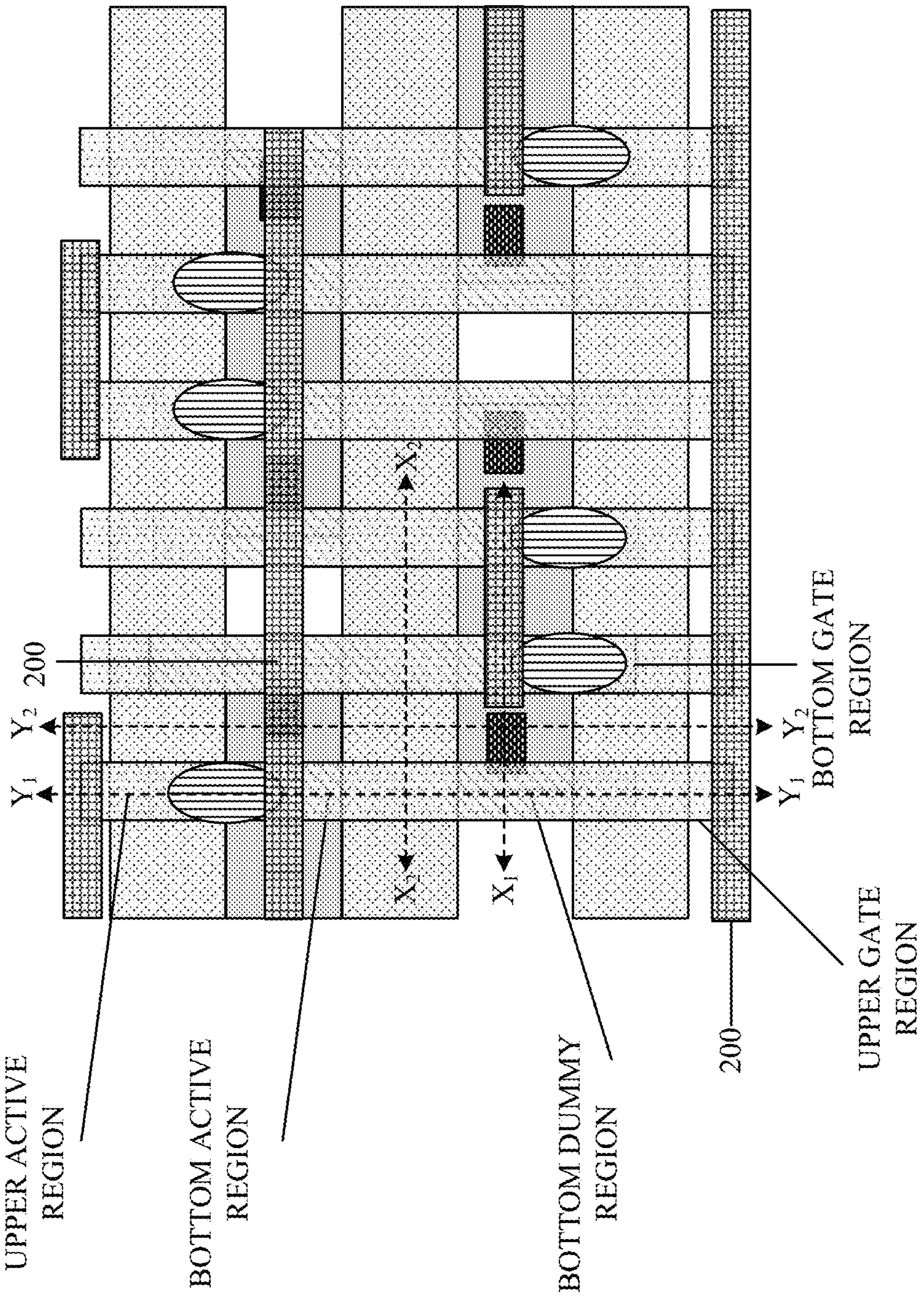
FIG. 32 illustrates a top-down view of the offset devices after the formation of a plurality of offset upper devices, in accordance with the embodiment of the present invention.
Figure 33:
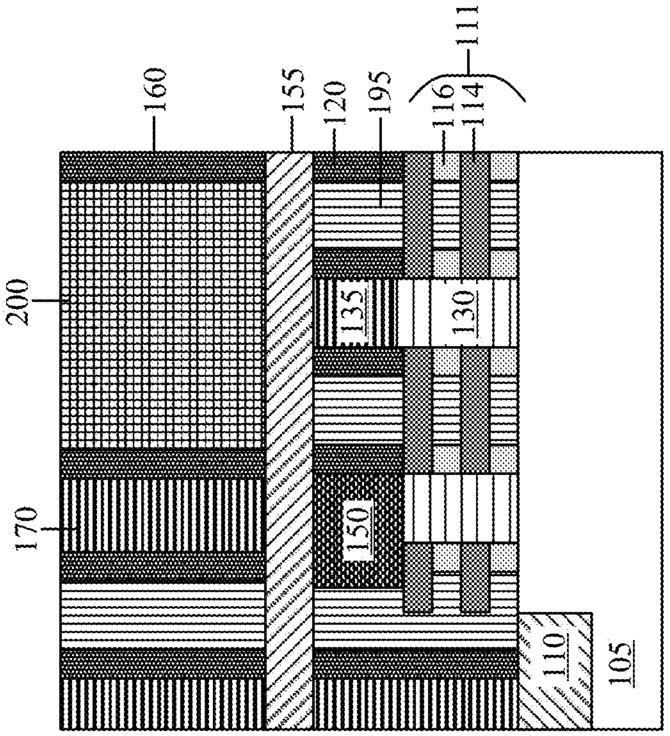
FIG. 33 illustrates a cross section $X_1$ of the bottom nano stack of offset stacked device in the gate region after the formation of upper gate cuts, in accordance with the embodiment of the present invention.
Figure 34:
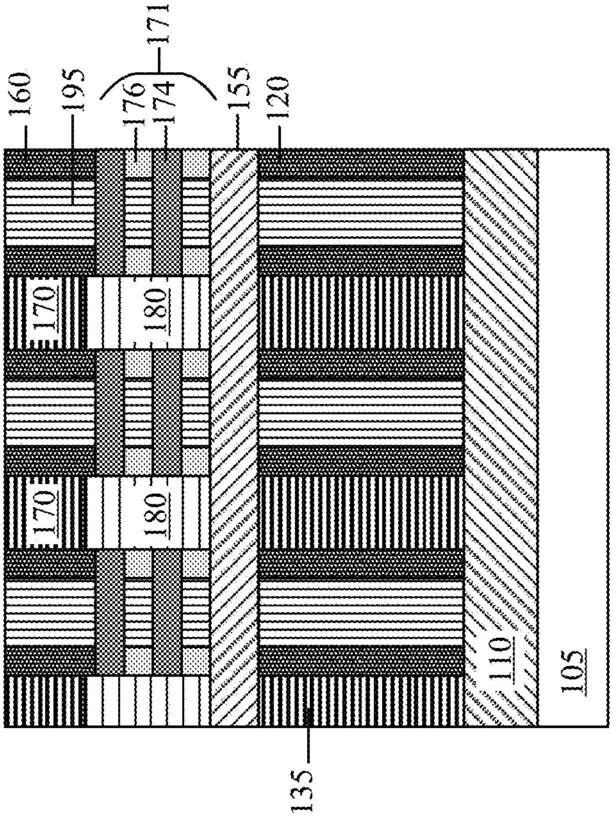
FIG. 34 illustrates a cross section $X_2$ of the bottom nano stack of offset stacked device in the bottom cut region after the formation of upper gate cuts, in accordance with the embodiment of the present invention.
Figure 35:
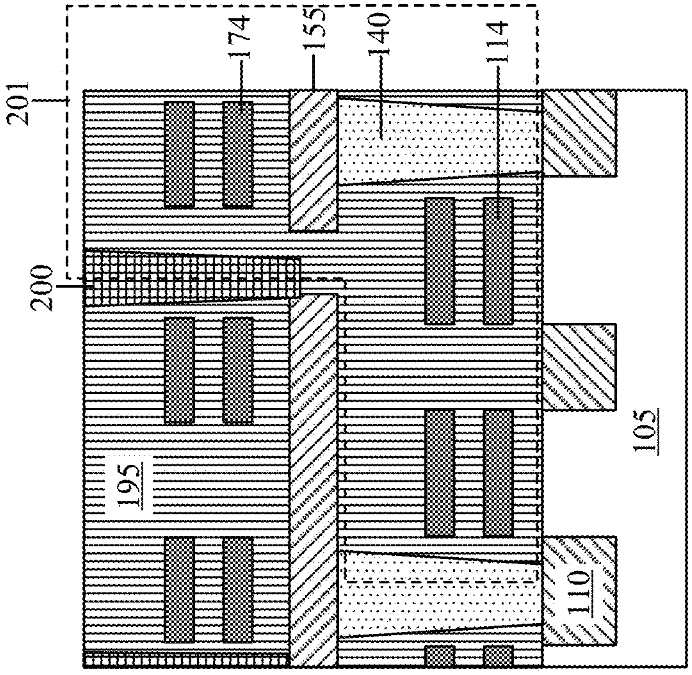
FIG. 35 illustrates a cross section $Y_1$ of the bottom nano stack of the offset stacked device in the gate region after the formation of upper gate cuts, in accordance with the embodiment of the present invention.
Figure 36:
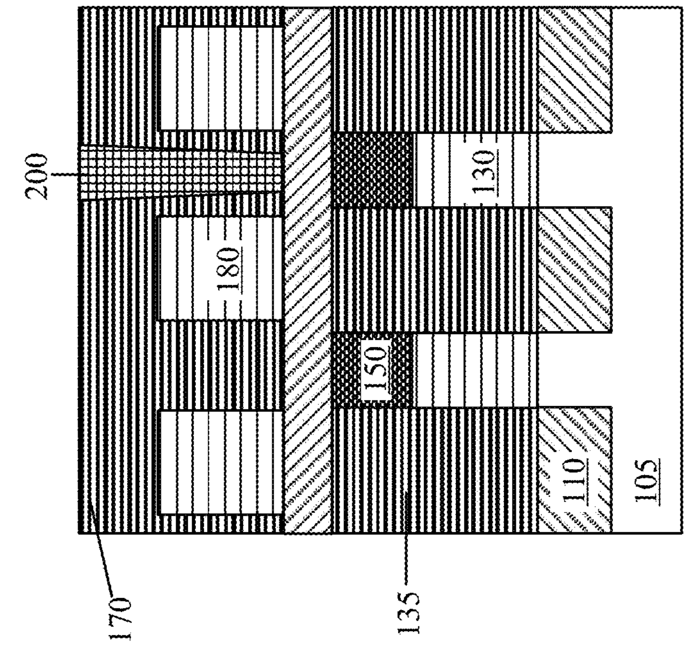
FIG. 36 illustrates a cross section $Y_2$ of the gate region of the bottom nano stack of the offset stacked device in the source/drain region after the formation of upper gate cuts, in accordance with the embodiment of the present invention.

FIGS. 32, 33, 34, 35 and 36, illustrate the processing stage after the formation of the upper gate cuts 200. FIG. 32 illustrates a top-down view after a plurality of upper gate cuts 200 were formed in the gate 195. As illustrated by FIG. 33, the upper gate cut 200 can extend laterally across a plurality of gates 195. The upper gate cuts 200 are formed by creating trenches (not shown) in the gate 195 and in the upper interlayer dielectric 170 and filling the trenches with a dielectric material. As illustrated in FIG. 35, gate 195 is continuous through the bonding oxide 155 to create a shared gate device between at least one bottom nano stack 111 and at least one upper nano stack 171. Dashed box 201 illustrates the shared gate device, as in the gate 195 is continuous between the bottom nano stacks 111 located between gate cuts 140 and the upper nano stack 171 located adjacent to the hole in the bonding oxide 155.

Figure 37:
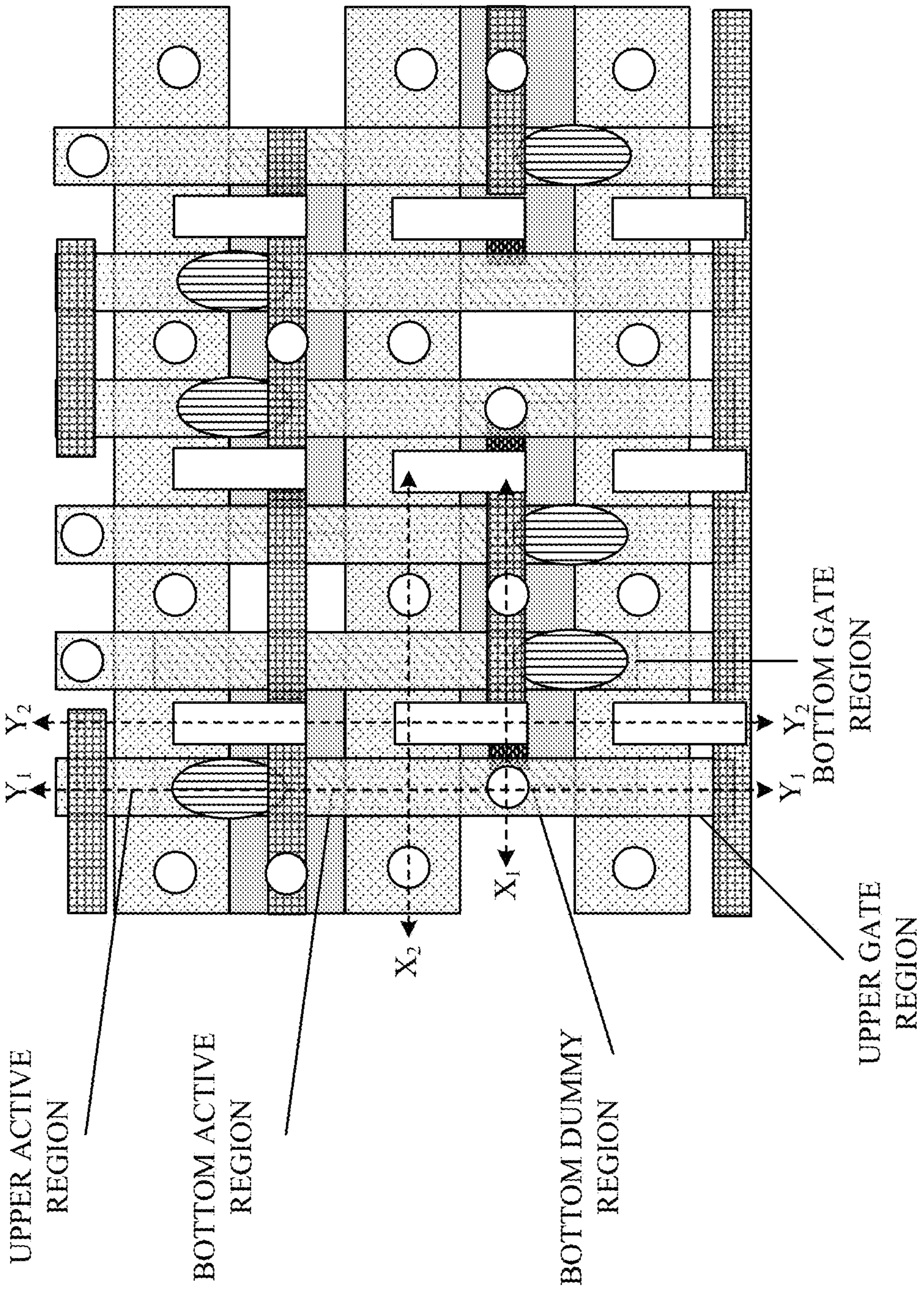
FIG. 37 illustrates a top-down view of the offset devices after the formation of a plurality of contact trenches, in accordance with the embodiment of the present invention.
Figure 38:
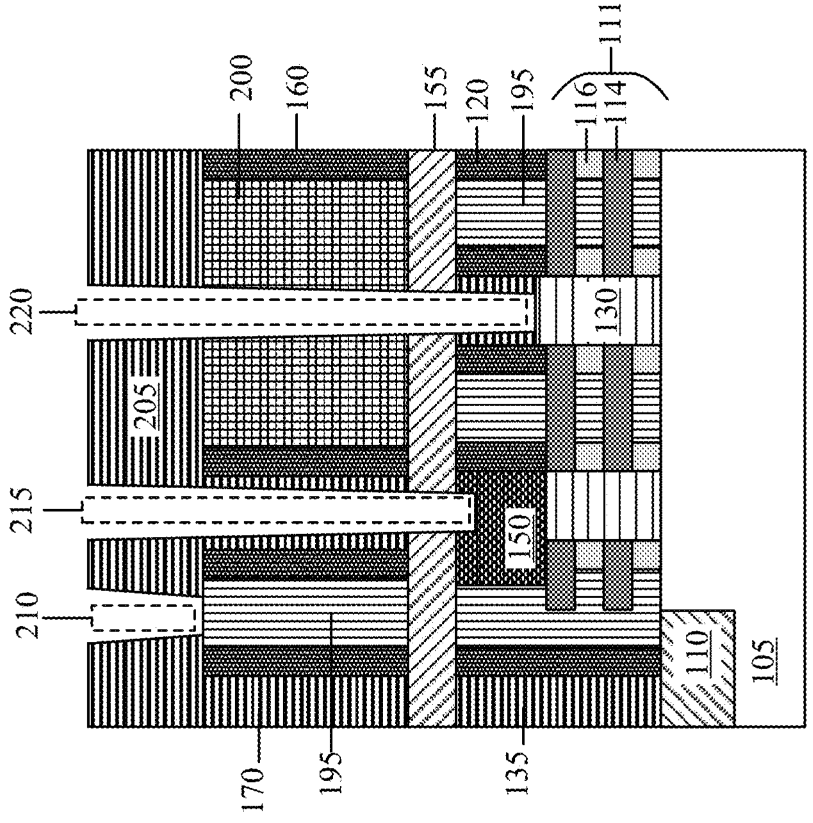
FIG. 38 illustrates a cross section $X_1$ of the bottom nano stack of offset stacked device in the gate region after the formation of contact trenches, in accordance with the embodiment of the present invention.
Figure 39:
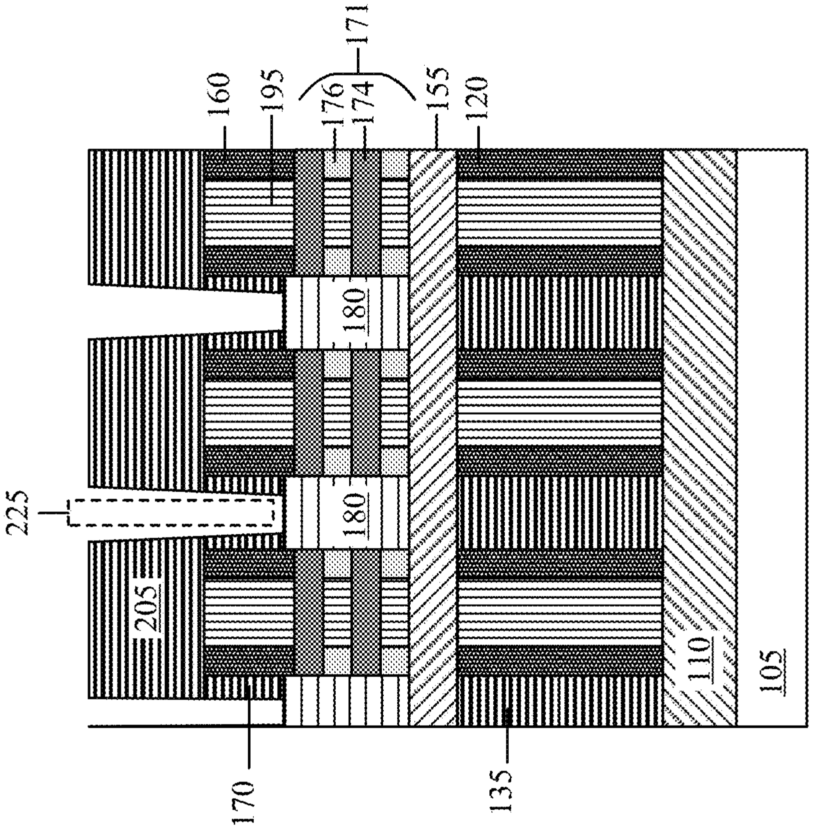
FIG. 39 illustrates a cross section $X_2$ of the bottom nano stack of offset stacked device in the bottom cut region after the formation of contact trenches, in accordance with the embodiment of the present invention.
Figure 41:
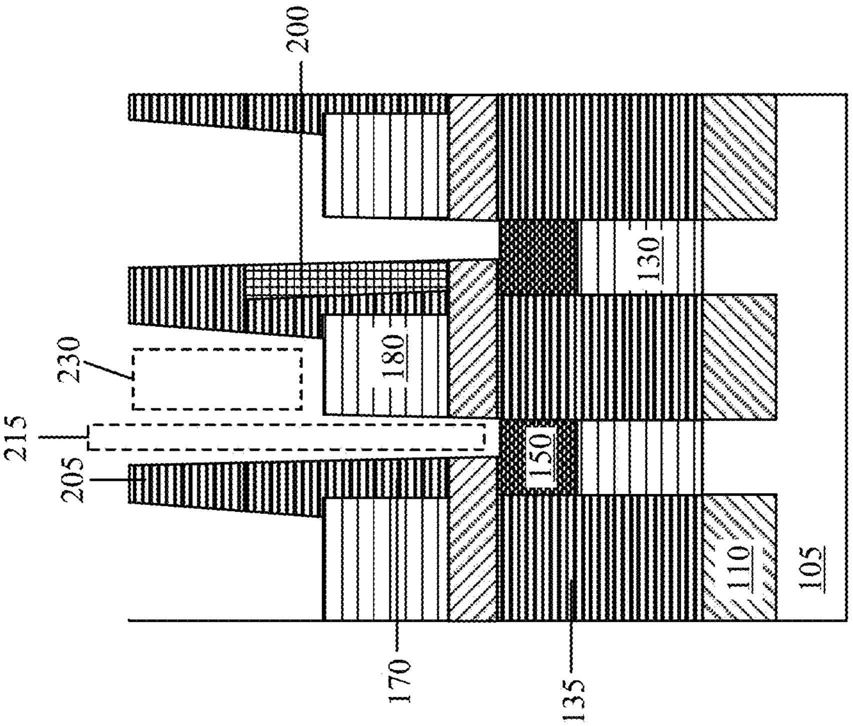
FIG. 41 illustrates a cross section $Y_2$ of the gate region of the bottom nano stack of the offset stacked device in the source/drain region after the formation of contact trenches, in accordance with the embodiment of the present invention.
Figure 40:
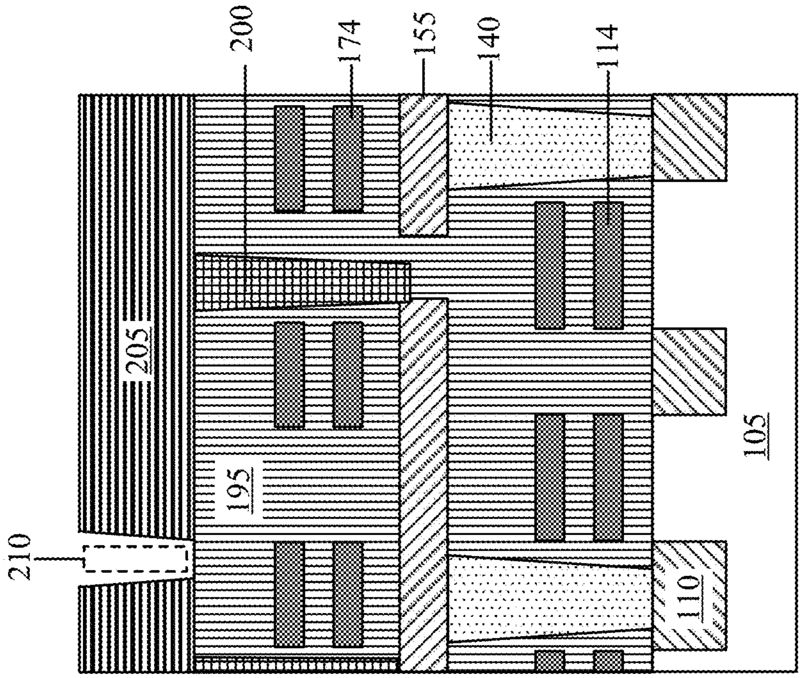
FIG. 40 illustrates a cross section $Y_1$ of the bottom nano stack of the offset stacked device in the gate region after the formation of contact trenches, in accordance with the embodiment of the present invention.
Figure 43:
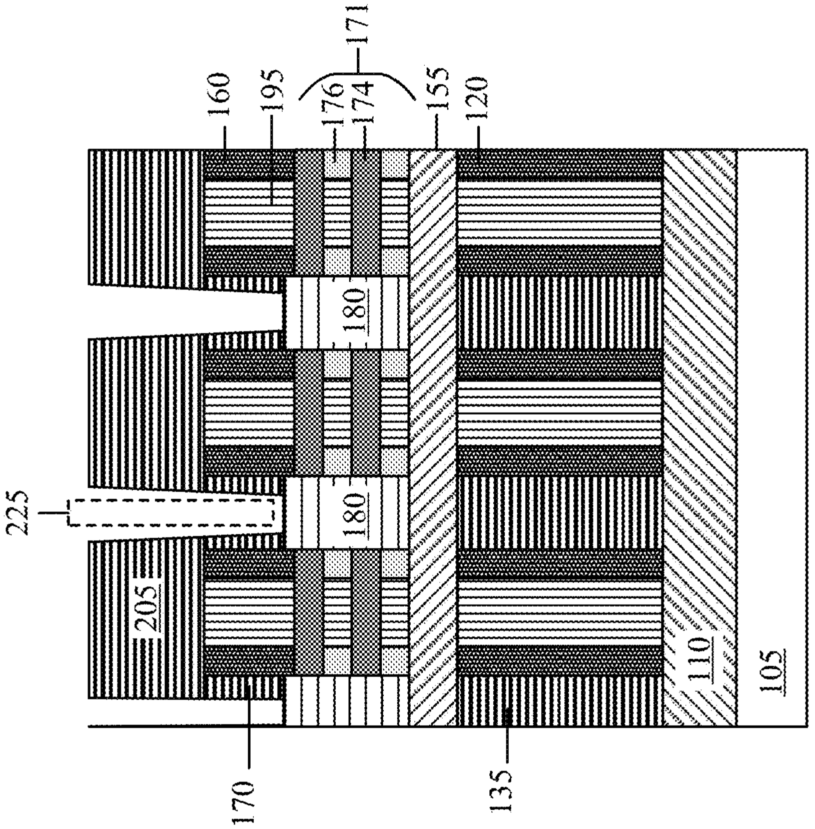
FIG. 43 illustrates a cross section $X_2$ of the bottom nano stack of offset stacked device in the bottom cut region after the removal of the bottom interconnect sacrificial layer, in accordance with the embodiment of the present invention.

FIGS. 37, 38, 39, 40 and 41, illustrate the processing stage after the formation of a plurality of contact trenches. A top interlayer dielectric 205 is formed on top of the exposed surface, i.e., the top interlayer dielectric 205 extends across the top surfaces of the entire microelectronic structure. FIG. 37 illustrates how the contact trenches are located on the devices. A first plurality of the contact trenches extends downward into the bottom devices, a second plurality of the contact trenches are located in the upper device, and a third plurality of contact trenches extend across multiple devices (e.g., the rectangular trenches that extend along the $Y_2$ cross section as illustrated by FIG. 37). The third plurality of contact trenches can be connected to other types of contact trenches. FIG. 38 illustrates that the contact trenches can extend downwards to different depths into the bottom device or the upper device. A first contact trench 210 extends downwards through the top interlayer dielectric 205 to expose a top surface of the gate 195 in the upper device. A second contact trench 210 extends downwards through the top interlayer dielectric 205, the upper interlayer dielectric 170, and the bonding oxide 155 to expose a surface of the bottom interconnect sacrificial layer 150. A third contact trench 220 extends downwards through the top interlayer dielectric 205, the upper interlayer dielectric 170, the bonding oxide 155, and the interlayer dielectric layer 135 to expose a surface of the bottom source/drain 130. FIG. 39 illustrates a fourth contact trench 225 that extends downwards through the top interlayer dielectric 205, and the upper interlayer dielectric 170 to expose a surface of the upper source/drain 180. FIG. 41 illustrates that a fifth contact trench 230 that extend along the upper device, where the fifth contact trench 230 is connected to the second contact trench 215, thus forming a shared trench that exposes at least one surface of the upper source/drain 180 and exposes a surface of the bottom interconnect sacrificial layer 150. The bottom interconnect sacrificial layer 150 extends in a first axis while the fifth contact trench 230 extends in a second axis, where the second axis is perpendicular to the first axis.

Figure 42:
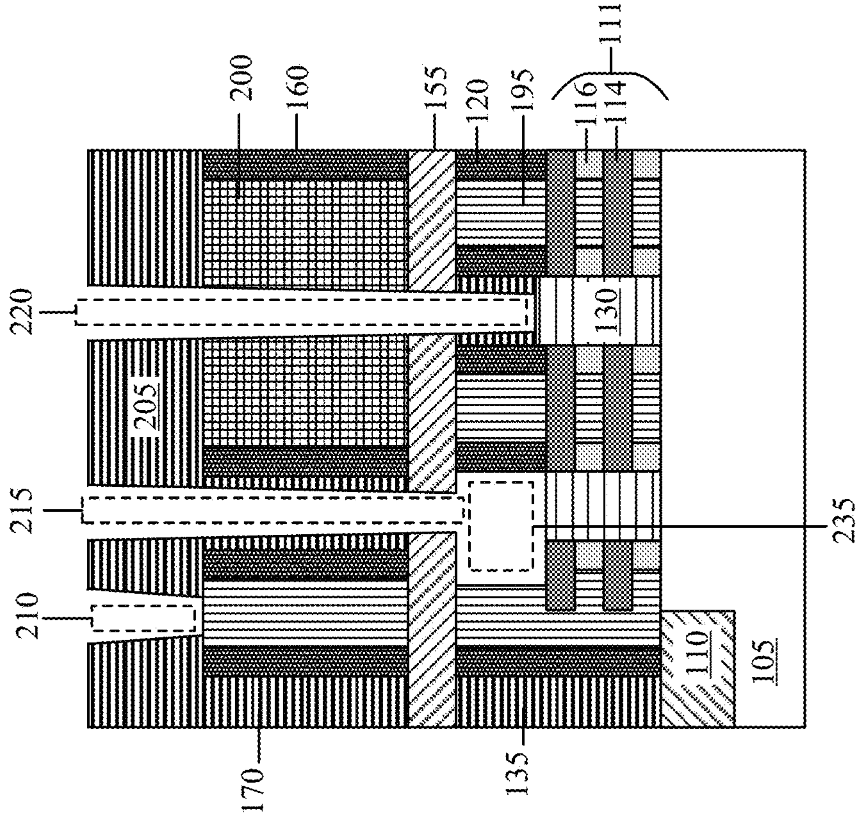
FIG. 42 illustrates a cross section $X_1$ of the bottom nano stack of offset stacked device in the gate region after the removal of the bottom interconnect sacrificial layer, in accordance with the embodiment of the present invention.
Figure 44:
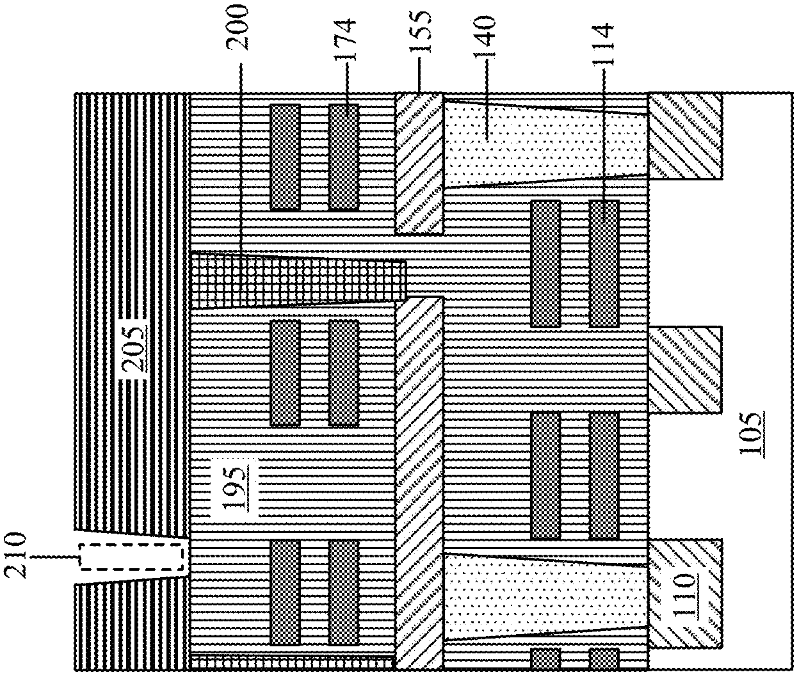
FIG. 44 illustrates a cross section $Y_1$ of the bottom nano stack of the offset stacked device in the gate region after the removal of the bottom interconnect sacrificial layer, in accordance with the embodiment of the present invention.
Figure 45:
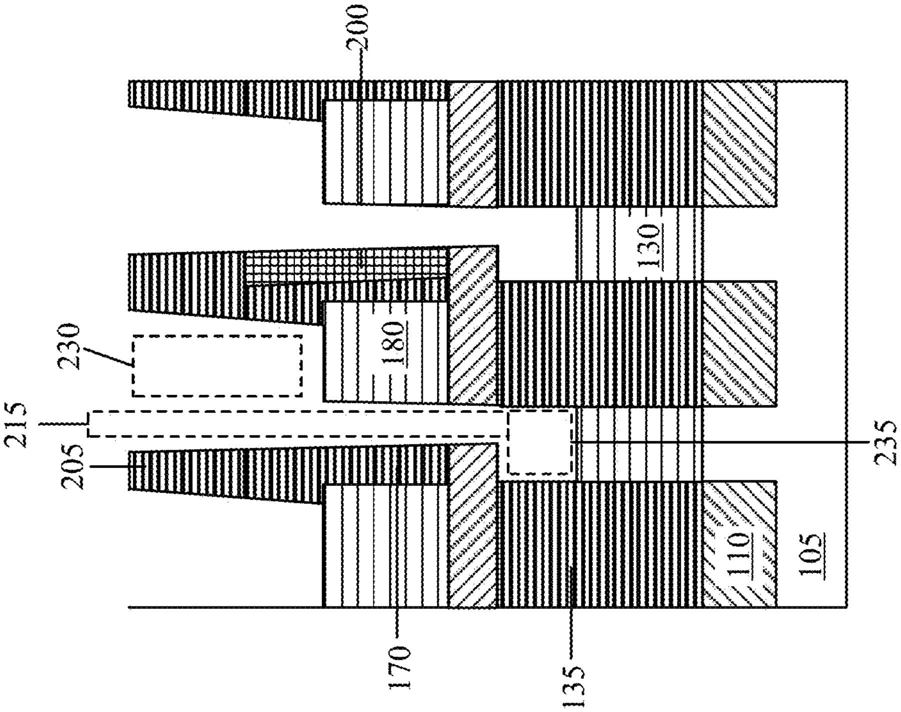
FIG. 45 illustrates a cross section $Y_2$ of the gate region of the bottom nano stack of the offset stacked device in the source/drain region after the removal of the bottom interconnect sacrificial layer, in accordance with the embodiment of the present invention.

FIGS. 42, 43, 44, and 45, illustrate the processing stage after the removal of the bottom interconnect sacrificial layer 150. Since a surface of the bottom interconnect sacrificial layer 150 is exposed by the second contact trench 215, this allows for the selective removal of the bottom interconnect sacrificial layer 150. Cavity 235 is created by the removal of the bottom interconnect sacrificial layer 150, where the cavity 235 is connected to the second contact trench 215. Cavity 235 exposes a sidewall of the gate 195 located around the dummy device, and the cavity 235 exposes a surface of the bottom source/drain 130, as illustrated by FIG. 42. As illustrated by FIG. 45, the cavity 235, the second contact trench 215, and the fifth contact trench 230 are connected to each other thus creating a shared trench/cavity/empty space.

Figure 47:
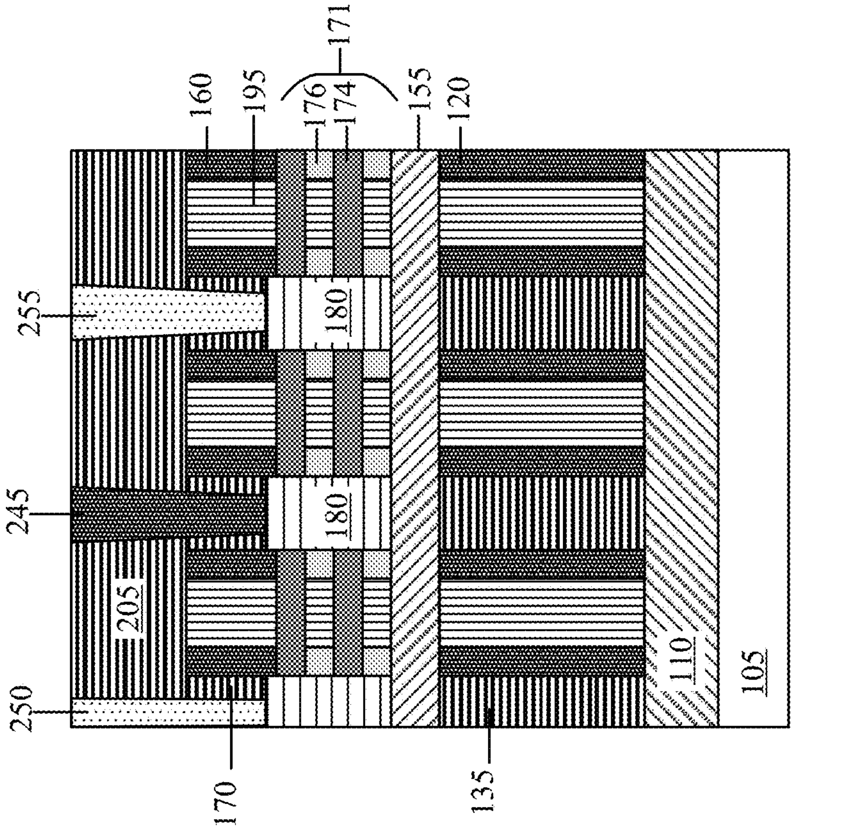
FIG. 47 illustrates a cross section $X_2$ of the bottom nano stack of offset stacked device in the bottom cut region after the formation of the contacts, in accordance with the embodiment of the present invention.
Figure 46:
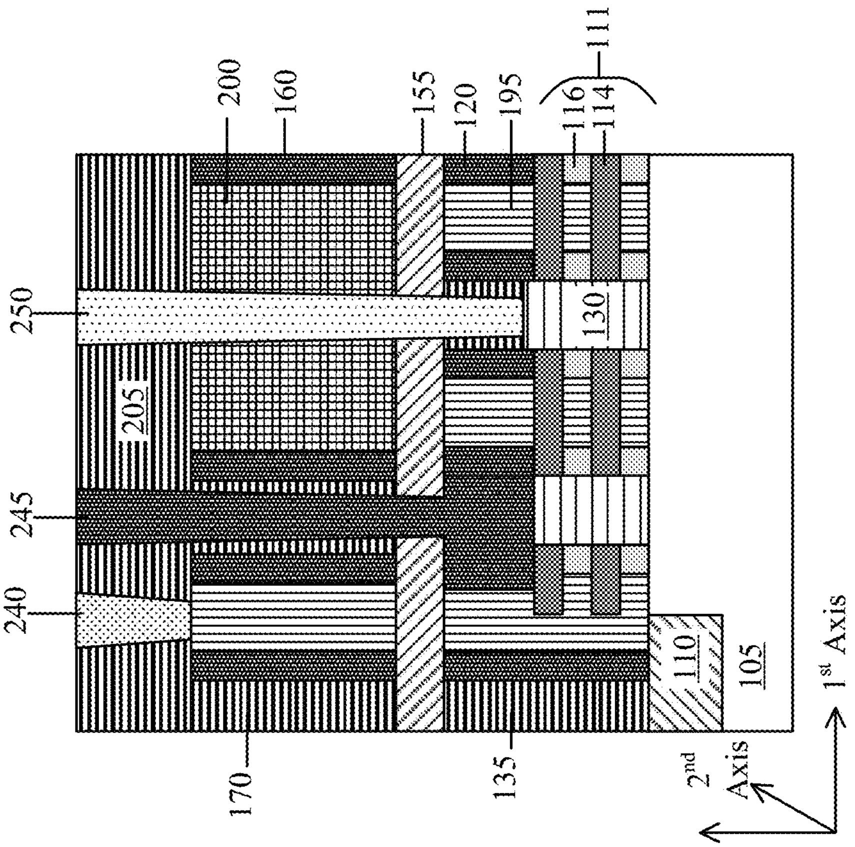
FIG. 46 illustrates a cross section $X_1$ of the bottom nano stack of offset stacked device in the gate region after the formation of the contacts, in accordance with the embodiment of the present invention.
Figure 49:
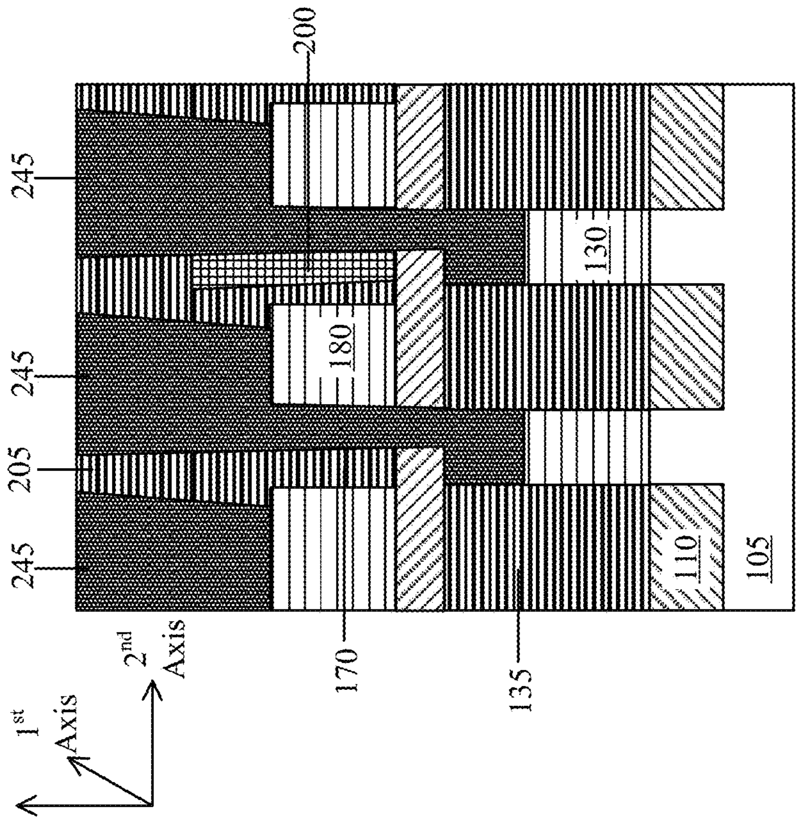
FIG. 49 illustrates a cross section $Y_2$ of the gate region of the bottom nano stack of the offset stacked device in the source/drain region after the formation of the contacts, in accordance with the embodiment of the present invention.
Figure 48:
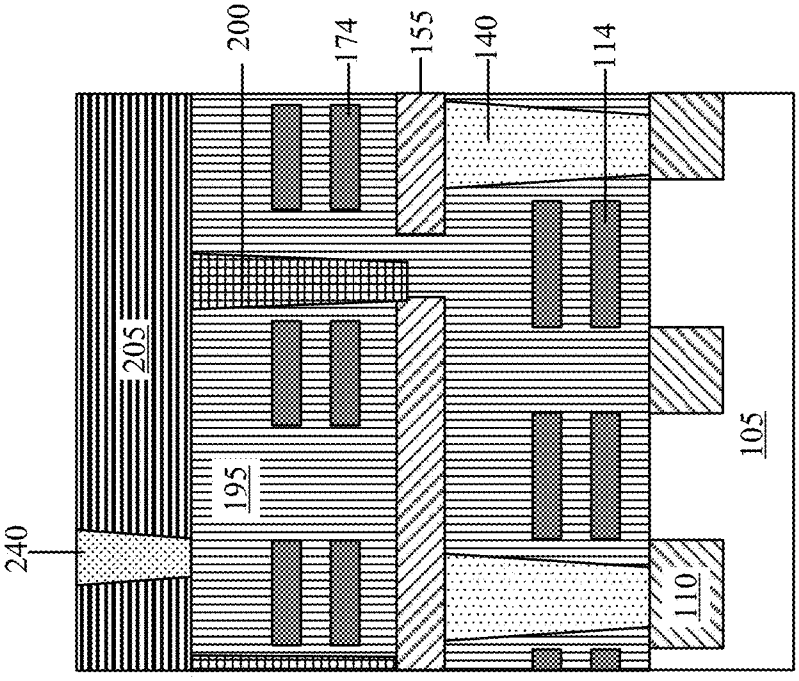
FIG. 48 illustrates a cross section $Y_1$ of the bottom nano stack of the offset stacked device in the gate region after the formation of the contacts, in accordance with the embodiment of the present invention.

FIGS. 46, 47, 48, and 49, illustrate the processing stage after metallization of the contacts. FIG. 46 illustrates the formation of an upper gate contact 240, a shared contact 245, and a bottom source/drain contact 250. The metallization process fills in the first contact trench 210 to form the upper gate contact 240. The metallization process fills in the third contact trench 220 to form a bottom source/drain contact 250. The metallization process fills in the fourth contact trench 225 to form an upper source/drain contact 255, as illustrated by FIG. 47. The metallization process fills in the cavity 235, the second contact trench 215, and the fifth contact trench 230 to form the shared contact 245, as illustrated by FIGS. 46 and 49. The shared contact 245 has a lower protrusion that is located on top of the bottom source/drain 130, where the lower protrusion is in contact with the gate 195 that is located around the dummy device (dummy transistor). The lower protrusion of shared contact 245 extends along the first axis. The shared contact 245 has an upper protrusion that extends along the upper source/drain 180. The upper protrusion of shared contact 245 extends along the second axis, wherein the first axis is perpendicular to the first axis. The upper protrusion and the lower protrusion of the shared contact 245 are connected to each other by a via section.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:

a static random-access memory (SRAM) device that includes a plurality of stacked transistors; and wherein the plurality of stacked transistors includes a shared device that includes a bottom transistor and an upper transistor, wherein the upper transistor is not in vertical alignment with the bottom transistor, wherein the plurality of stacked transistors includes an oxide layer located between the upper transistor and the bottom transistor, wherein the shared device includes a shared gate that extends through the oxide layer to connect a plurality of upper channel layers of the upper transistor and a plurality of lower channel layers of the bottom transistor, wherein the plurality of stacked transistors includes a plurality of upper gate cuts and a plurality of lower gate cuts, wherein the upper gate cuts separate gate regions of adjacent upper transistors from each other and the lower gate cuts separate lower gate regions from each other, wherein the plurality of upper gate cuts and the plurality of lower gate cuts are located on different levels;

wherein the plurality of stacked transistors includes an isolated upper transistor, wherein a gate region of the isolated upper transistor is not connected to a lower gate located in a bottom region of the plurality of stacked transistors, wherein one of the upper gate cuts separates the isolated upper transistor and the shared gate of the shared device, wherein the isolated upper transistor is located on one side of the one upper gate cut and the shared gate is located on a second side of the one upper gate cut.

2. The microelectronic structure of claim 1, further comprising:

a plurality of contacts to connect to components of the plurality of stacked transistors.

3. The microelectronic structure of claim 2, wherein the plurality of contacts includes an upper gate contact, wherein the upper gate contact is connected to a gate located around the upper transistor.

4. The microelectronic structure of claim 2, wherein the plurality of contacts includes an upper source/drain contact, wherein the upper source/drain contact is connected to an upper source/drain of the upper transistor.

5. The microelectronic structure of claim 2, wherein the plurality of contacts includes a bottom source/drain contact, wherein the bottom source/drain contact is connected to a bottom source/drain of the bottom transistor.

6. The microelectronic structure of claim 2, wherein the plurality of contacts includes a shared contact, wherein the shared contact is connected to an upper source/drain of the upper transistor and a bottom source/drain of the bottom transistor.

7. The microelectronic structure of claim 6, wherein the shared contact includes a bottom protrusion and an upper protrusion.

8. The microelectronic structure of claim 7, wherein the bottom protrusion and the upper protrusion are connected to each other by a via.

9. The microelectronic structure of claim 8, wherein the bottom protrusion extends along a first axis and the upper protrusion extends along a second axis.

10. The microelectronic structure of claim 9, wherein the first axis is perpendicular to the second axis.

11. A microelectronic structure comprising:

a static random-access memory (SRAM) device that includes a plurality of stacked transistors;

each of the plurality of stacked transistors includes a bottom transistor and an upper transistor, wherein the upper transistor is not in vertical alignment with the bottom transistor;

a bottom dummy device, wherein the dummy device includes a plurality of nanosheets that extends laterally from a bottom source/drain, wherein an inner spacer is located between the plurality of nanosheets, wherein a gate structure is in contact with at least three different surfaces of each of the plurality of nanosheets and the gate structure contacts the inner spacer, wherein the inner spacer has a first side surface in contact with the bottom source/drain and a second side surface of the inner spacer that is in contact with the gate structure when viewed from a cross section that extends across multiple gate regions of the bottom transistors for the plurality of stacked transistors; and a shared contact, wherein the shared contact is connected to an upper source/drain of the upper transistor and the bottom source/drain of the bottom transistor, and wherein the shared contact is in direct contact with and extends partially along a surface of a nanosheet of the plurality of nanosheets of the bottom dummy device, wherein the shared contact further directly contacts the gate structure of the bottom dummy device that is in contact with a top surface of the nanosheet of the plurality of nanosheets of the bottom dummy device when viewed from the cross section that extends across multiple gate regions of the bottom transistors for the plurality of stacked transistors.

12. The microelectronic structure of claim 11, wherein the shared contact includes a bottom protrusion and an upper protrusion.

13. The microelectronic structure of claim 12, wherein the bottom protrusion and the upper protrusion are connected to each other by a via.

14. The microelectronic structure of claim 13, wherein the bottom protrusion extends along a first axis and the upper protrusion extends along a second axis.

15. The microelectronic structure of claim 14, wherein the first axis is perpendicular to the second axis.

16. The microelectronic structure of claim 15, wherein the bottom protrusion of the shared contact is in contact with a gate of the bottom dummy device.

17. The microelectronic structure of claim 16, wherein a bottom surface of the bottom protrusion of the shared contact is in contact with the bottom source/drain and the dummy device.

* * * * *